US009159527B2

United States Patent
Ward et al.

(10) Patent No.: US 9,159,527 B2
(45) Date of Patent: Oct. 13, 2015

(54) SYSTEMS AND METHODS FOR A GAS FIELD IONIZATION SOURCE

(75) Inventors: Billy W. Ward, Merrimac, MA (US); Lou Farkas, Durham, NH (US); John A. Notte, Gloucester, MA (US); Randall Percival, Raymond, NH (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 1550 days.

(21) Appl. No.: 12/100,570

(22) Filed: Apr. 10, 2008

(65) Prior Publication Data

US 2008/0217555 A1    Sep. 11, 2008

Related U.S. Application Data

(63) Continuation-in-part of application No. 10/966,243, filed on Oct. 15, 2004, now Pat. No. 7,368,727, and a continuation-in-part of application No. 11/385,136, filed on Mar. 20, 2006, now abandoned.

(60) Provisional application No. 60/511,726, filed on Oct. 16, 2003.

(51) Int. Cl.
*H01J 27/00* (2006.01)
*H01J 37/08* (2006.01)
*H01J 27/26* (2006.01)

(52) U.S. Cl.
CPC ............... *H01J 37/08* (2013.01); *H01J 27/26* (2013.01); *H01J 2237/065* (2013.01); *H01J 2237/06341* (2013.01); *H01J 2237/0807* (2013.01); *H01J 2237/28* (2013.01)

(58) Field of Classification Search
None
See application file for complete search history.

(56) References Cited

U.S. PATENT DOCUMENTS

| 2,893,624 A | 7/1959 | Fricke |
| 3,121,155 A | 2/1964 | Berry |
| 3,602,710 A | 8/1971 | Mueller |
| 3,622,782 A | 11/1971 | Smith et al. |
| 3,777,211 A | 12/1973 | Kuijpers |
| 3,817,592 A * | 6/1974 | Swanson ............... 445/2 |
| 3,868,507 A | 2/1975 | Panitz |
| 3,889,115 A | 6/1975 | Tamura et al. |

(Continued)

FOREIGN PATENT DOCUMENTS

| DE | 196 04 272 | 8/1996 |
| DE | 197 15 226 A | 10/1998 |

(Continued)

OTHER PUBLICATIONS

Livengood et al., "Helium ion microscope invasiveness and imaging study for semiconductor applications," J. Vac. Sci. Technolog., 25(6):2547-2552, (2007).

(Continued)

*Primary Examiner* — Andrew Smyth
(74) *Attorney, Agent, or Firm* — Fish & Richardson P.C.

(57) ABSTRACT

In one aspect the invention provides a gas field ion source assembly that includes an ion source in connection with an optical column such that an ion beam generated at the ion source travels through the optical column. The ion source includes an emitter having a width that tapers to a tip comprising a few atoms. In other aspects, the methods provide for manufacturing, maintaining and enhancing the performance of a gas field ion source including sharpening the tip of the ion source in situ.

36 Claims, 20 Drawing Sheets

(56) References Cited

U.S. PATENT DOCUMENTS

| | | | |
|---|---|---|---|
| 3,947,716 A * | 3/1976 | Fraser et al. | 313/336 |
| 4,044,255 A | 8/1977 | Krisch et al. | |
| 4,117,322 A | 9/1978 | McKinney | |
| 4,139,773 A * | 2/1979 | Swanson | 250/423 R |
| 4,236,073 A | 11/1980 | Martin | |
| 4,255,661 A | 3/1981 | Liebl | |
| 4,277,304 A * | 7/1981 | Horiike et al. | 438/712 |
| 4,324,999 A * | 4/1982 | Wolfe | 313/336 |
| 4,352,985 A | 10/1982 | Martin | |
| 4,379,250 A * | 4/1983 | Hosoki et al. | 313/336 |
| 4,451,737 A | 5/1984 | Isakozawa | |
| 4,467,240 A | 8/1984 | Futamoto et al. | |
| 4,588,928 A * | 5/1986 | Liu et al. | 315/382 |
| 4,629,898 A | 12/1986 | Orloff | |
| 4,633,084 A | 12/1986 | Gruen et al. | |
| 4,638,209 A | 1/1987 | Asamaki et al. | |
| 4,639,301 A | 1/1987 | Doherty et al. | |
| 4,649,316 A | 3/1987 | Cleaver et al. | |
| 4,670,290 A * | 6/1987 | Itoh et al. | 427/446 |
| 4,721,878 A | 1/1988 | Hagiwara et al. | |
| 4,774,414 A | 9/1988 | Umemura et al. | |
| 4,785,177 A | 11/1988 | Besocke | |
| 4,831,308 A * | 5/1989 | Konishi et al. | 313/362.1 |
| 4,874,947 A | 10/1989 | Ward et al. | |
| 4,922,106 A * | 5/1990 | Berrian et al. | 250/492.2 |
| 4,936,968 A | 6/1990 | Ohnishi et al. | |
| 4,954,711 A | 9/1990 | Fink et al. | |
| 4,983,540 A | 1/1991 | Yamaguchi et al. | |
| 4,983,830 A | 1/1991 | Iwasaki | |
| 4,985,634 A | 1/1991 | Stengl et al. | |
| 5,019,709 A * | 5/1991 | Pfaff | 250/324 |
| 5,034,612 A | 7/1991 | Ward et al. | |
| 5,055,696 A | 10/1991 | Haraichi et al. | |
| 5,059,785 A | 10/1991 | Doyle et al. | |
| 5,061,850 A * | 10/1991 | Kelly et al. | 850/1 |
| 5,063,294 A | 11/1991 | Kawata et al. | |
| 5,083,033 A | 1/1992 | Komano et al. | |
| 5,093,572 A | 3/1992 | Hosono | |
| 5,151,594 A | 9/1992 | McClelland | |
| 5,176,557 A * | 1/1993 | Okunuki et al. | 445/24 |
| 5,188,705 A | 2/1993 | Swanson et al. | |
| 5,201,681 A * | 4/1993 | Okunuki et al. | 445/24 |
| 5,249,340 A * | 10/1993 | Kane et al. | 445/50 |
| 5,291,274 A * | 3/1994 | Tamura | 257/30 |
| 5,324,950 A | 6/1994 | Otaka et al. | |
| 5,359,254 A * | 10/1994 | Arkhipov et al. | 313/15 |
| 5,414,261 A | 5/1995 | Ellisman et al. | |
| 5,440,124 A * | 8/1995 | Kelly et al. | 850/63 |
| 5,449,968 A * | 9/1995 | Terui et al. | 313/362.1 |
| 5,469,014 A * | 11/1995 | Itoh et al. | 313/308 |
| 5,482,486 A * | 1/1996 | Vaudaine et al. | 445/3 |
| 5,502,306 A | 3/1996 | Meisburger et al. | |
| 5,574,280 A | 11/1996 | Fujii et al. | |
| 5,616,926 A * | 4/1997 | Shinada et al. | 250/423 F |
| 5,620,832 A * | 4/1997 | Sung et al. | 430/311 |
| 5,750,990 A | 5/1998 | Mizuno et al. | |
| 5,763,880 A * | 6/1998 | Nisiyama et al. | 250/310 |
| 5,783,830 A | 7/1998 | Hirose et al. | |
| 5,793,154 A * | 8/1998 | Itoh et al. | 313/308 |
| 5,821,549 A | 10/1998 | Talbot et al. | |
| 5,900,629 A | 5/1999 | Todokoro et al. | |
| 5,916,424 A | 6/1999 | Libby et al. | |
| 5,976,390 A | 11/1999 | Muramatsu | |
| 5,986,270 A | 11/1999 | Bormans et al. | |
| 5,993,636 A * | 11/1999 | Terui et al. | 205/640 |
| 6,028,953 A | 2/2000 | Nakamura et al. | |
| 6,039,000 A | 3/2000 | Libby et al. | |
| 6,040,973 A * | 3/2000 | Okamoto et al. | 361/235 |
| 6,042,736 A | 3/2000 | Chung | |
| 6,042,738 A | 3/2000 | Casey et al. | |
| 6,091,190 A * | 7/2000 | Chalamala et al. | 313/346 R |
| 6,190,511 B1 * | 2/2001 | Wei | 204/192.11 |
| 6,211,527 B1 | 4/2001 | Chandler | |
| 6,268,608 B1 | 7/2001 | Chandler | |
| 6,354,438 B1 | 3/2002 | Lee et al. | |
| 6,395,347 B1 | 5/2002 | Adachi et al. | |
| 6,414,307 B1 | 7/2002 | Gerlach et al. | |
| 6,495,965 B1 * | 12/2002 | Yamaura et al. | 315/167 |
| 6,504,151 B1 | 1/2003 | Mitchell et al. | |
| 6,538,254 B1 | 3/2003 | Tomimatsu et al. | |
| 6,576,894 B1 | 6/2003 | Doong | |
| 6,579,665 B2 | 6/2003 | Lee et al. | |
| 6,581,023 B1 | 6/2003 | Kim | |
| 6,635,884 B2 | 10/2003 | Plontke et al. | |
| 6,639,227 B1 * | 10/2003 | Glavish et al. | 250/492.2 |
| 6,664,739 B1 * | 12/2003 | Kishinevsky et al. | 315/111.41 |
| 6,700,122 B2 | 3/2004 | Matsui et al. | |
| 6,727,500 B1 | 4/2004 | Berger et al. | |
| 6,753,535 B2 | 6/2004 | Rose | |
| 6,791,084 B2 | 9/2004 | Shimoma et al. | |
| 6,822,245 B2 | 11/2004 | Muto et al. | |
| 6,833,719 B2 | 12/2004 | Hasegawa et al. | |
| 6,875,981 B2 | 4/2005 | Nishikawa | |
| 7,084,399 B2 | 8/2006 | Muto et al. | |
| 7,119,333 B2 | 10/2006 | Herschbein et al. | |
| 7,157,702 B2 | 1/2007 | Gribb | |
| 7,230,244 B2 | 6/2007 | Trotz et al. | |
| 7,321,118 B2 | 1/2008 | Ward | |
| 7,368,727 B2 | 5/2008 | Ward | |
| 7,414,243 B2 | 8/2008 | Ward | |
| 7,485,873 B2 | 2/2009 | Ward et al. | |
| 7,488,952 B2 | 2/2009 | Ward et al. | |
| 7,495,232 B2 | 2/2009 | Ward et al. | |
| 7,504,639 B2 | 3/2009 | Ward et al. | |
| 7,511,279 B2 | 3/2009 | Ward et al. | |
| 7,511,280 B2 | 3/2009 | Ward et al. | |
| 7,518,122 B2 | 4/2009 | Ward et al. | |
| 7,521,693 B2 | 4/2009 | Ward et al. | |
| 7,554,096 B2 | 6/2009 | Ward et al. | |
| 7,554,097 B2 | 6/2009 | Ward et al. | |
| 7,557,358 B2 | 7/2009 | Ward et al. | |
| 7,557,359 B2 | 7/2009 | Ward et al. | |
| 7,557,360 B2 | 7/2009 | Ward et al. | |
| 7,557,361 B2 | 7/2009 | Ward et al. | |
| 2002/0036263 A1 * | 3/2002 | Shiokawa et al. | 250/288 |
| 2002/0066863 A1 | 6/2002 | Chao et al. | |
| 2002/0127483 A1 | 9/2002 | Baek et al. | |
| 2002/0134949 A1 | 9/2002 | Gerlach et al. | |
| 2002/0144892 A1 | 10/2002 | Lee et al. | |
| 2002/0170675 A1 | 11/2002 | Libby et al. | |
| 2003/0047691 A1 | 3/2003 | Musil et al. | |
| 2003/0062487 A1 | 4/2003 | Hiroi et al. | |
| 2003/0098416 A1 | 5/2003 | Shemesh et al. | |
| 2003/0122085 A1 * | 7/2003 | Stengl et al. | 250/423 F |
| 2003/0174879 A1 | 9/2003 | Chen | |
| 2003/0219658 A1 | 11/2003 | Shishido et al. | |
| 2004/0031936 A1 | 2/2004 | Oi et al. | |
| 2004/0065826 A1 | 4/2004 | Berger et al. | |
| 2004/0084616 A1 * | 5/2004 | Hirano et al. | 250/288 |
| 2004/0113097 A1 | 6/2004 | Marchman et al. | |
| 2004/0121069 A1 | 6/2004 | Ferranti et al. | |
| 2004/0154744 A1 | 8/2004 | Kaito et al. | |
| 2005/0045821 A1 | 3/2005 | Noji et al. | |
| 2005/0052192 A1 | 3/2005 | Hung | |
| 2005/0089773 A1 | 4/2005 | Shur et al. | |
| 2005/0178980 A1 | 8/2005 | Skidmore et al. | |
| 2005/0279952 A1 | 12/2005 | Ishitani et al. | |
| 2006/0060777 A1 | 3/2006 | Motoi | |
| 2006/0076494 A1 | 4/2006 | Bloess et al. | |
| 2006/0097166 A1 | 5/2006 | Ishitani et al. | |
| 2006/0197017 A1 | 9/2006 | Motoi et al. | |
| 2006/0219953 A1 | 10/2006 | Carleson | |
| 2006/0284091 A1 | 12/2006 | Ward | |
| 2006/0284092 A1 | 12/2006 | Ward | |
| 2007/0025907 A1 | 2/2007 | Rezeq et al. | |
| 2007/0051900 A1 | 3/2007 | Ward | |
| 2007/0057182 A1 | 3/2007 | Feuerbaum | |
| 2007/0138388 A1 | 6/2007 | Ward et al. | |
| 2007/0158555 A1 | 7/2007 | Ward et al. | |
| 2007/0158556 A1 | 7/2007 | Ward et al. | |
| 2007/0158557 A1 | 7/2007 | Ward et al. | |
| 2007/0158558 A1 | 7/2007 | Ward et al. | |
| 2007/0158580 A1 | 7/2007 | Ward et al. | |
| 2007/0158581 A1 | 7/2007 | Ward et al. | |

(56) References Cited

U.S. PATENT DOCUMENTS

| | | |
|---|---|---|
| 2007/0158582 A1 | 7/2007 | Ward et al. |
| 2007/0187621 A1 | 8/2007 | Ward et al. |
| 2007/0194226 A1 | 8/2007 | Ward et al. |
| 2007/0194251 A1 | 8/2007 | Ward et al. |
| 2007/0205375 A1 | 9/2007 | Ward et al. |
| 2007/0210250 A1 | 9/2007 | Ward et al. |
| 2007/0210251 A1 | 9/2007 | Ward et al. |
| 2007/0215802 A1 | 9/2007 | Ward et al. |
| 2007/0221843 A1 | 9/2007 | Ward et al. |
| 2007/0227883 A1 | 10/2007 | Ward et al. |
| 2007/0228287 A1 | 10/2007 | Ward et al. |
| 2008/0067385 A1 | 3/2008 | Tokuda et al. |
| 2008/0067408 A1 | 3/2008 | Winkler |
| 2008/0111069 A1 | 5/2008 | Notte |
| 2008/0217531 A1 | 9/2008 | Muray et al. |

FOREIGN PATENT DOCUMENTS

| | | | | |
|---|---|---|---|---|
| DE | 197 44 126 A | 4/1999 | | |
| EP | 0 225 969 | 6/1987 | | |
| EP | 0 317 952 | 5/1989 | | |
| EP | 0 427 532 | 5/1991 | | |
| EP | 0 477 992 A2 | 4/1992 | | |
| EP | 0 643 297 | 3/1995 | | |
| EP | 0 734 045 | 9/1996 | | |
| EP | 1 491 654 | 12/2004 | | |
| EP | 1 655 265 | 5/2006 | | |
| EP | 1 696 219 | 8/2006 | | |
| EP | 1 746 386 | 1/2007 | | |
| EP | 2 031 633 | 3/2009 | | |
| FR | 2244257 A | 4/1975 | | |
| GB | 1 604 898 | 12/1981 | | |
| GB | 2 225 156 | 5/1990 | | |
| JP | 55-126949 | 10/1980 | | |
| JP | 5-209844 | 12/1983 | | |
| JP | 60180048 A | * 9/1985 | ............. | H01J 37/08 |
| JP | 61-171048 | 8/1986 | | |
| JP | 62 051134 | 3/1987 | | |
| JP | 63 040241 A | 2/1988 | | |
| JP | 63 045740 | 2/1988 | | |
| JP | 63 200434 | 8/1988 | | |
| JP | 63205033 A | * 8/1988 | ............. | H01J 27/26 |
| JP | 63248039 A | * 10/1988 | ............. | H01J 27/26 |
| JP | 63248040 A | * 10/1988 | ............. | H01J 27/26 |
| JP | 63279535 A | * 11/1988 | ................ | H01J 9/02 |
| JP | 64-44555 | 3/1989 | | |
| JP | 1-130450 | 5/1989 | | |
| JP | 01-189839 | 7/1989 | | |
| JP | 01-315937 | 12/1989 | | |
| JP | 02-061941 | 3/1990 | | |
| JP | 02 087440 | 3/1990 | | |
| JP | 02-186545 | 7/1990 | | |
| JP | 03-214554 | 9/1991 | | |
| JP | 03-266336 | 11/1991 | | |
| JP | 03 276547 | 12/1991 | | |
| JP | 04 341734 | 11/1992 | | |
| JP | 04 341743 | 11/1992 | | |
| JP | 5275050 | 10/1993 | | |
| JP | 05-297146 | 11/1993 | | |
| JP | 06-192858 | 7/1994 | | |
| JP | 06-231716 | 8/1994 | | |
| JP | 07-021955 | 1/1995 | | |
| JP | 07-045230 | 2/1995 | | |
| JP | 07-105834 | 4/1995 | | |
| JP | 07-230783 | 8/1995 | | |
| JP | 2789610 | 8/1995 | | |
| JP | 07-272652 | 10/1995 | | |
| JP | 10-162769 | 6/1998 | | |
| JP | 10-223574 | 8/1998 | | |
| JP | 11-045679 | 2/1999 | | |
| JP | 2000-146876 | 5/2000 | | |
| JP | 2000-299361 | 10/2000 | | |
| JP | 2000-311644 | 11/2000 | | |
| JP | 2001 176440 | 6/2001 | | |
| JP | 2001-297981 | 10/2001 | | |
| JP | 02 025488 | 1/2002 | | |
| JP | 2003 086126 | 3/2003 | | |
| JP | 2003-197138 | 7/2003 | | |
| JP | 2003 302579 A | 10/2003 | | |
| JP | 2004-020459 | 1/2004 | | |
| JP | 2004-111839 | 4/2004 | | |
| JP | 2004-226079 | 8/2004 | | |
| JP | 2004 265629 | 9/2004 | | |
| JP | 2005-235782 | 9/2005 | | |
| JP | 2008 270073 | 11/2008 | | |
| WO | WO 98/47172 | 10/1998 | | |
| WO | WO 01/04611 | 1/2001 | | |
| WO | WO 01/59806 | 8/2001 | | |
| WO | WO 2004/015496 | 2/2004 | | |
| WO | WO 2004/044596 | 5/2004 | | |
| WO | WO 2004/068538 | 8/2004 | | |
| WO | WO 2006/133241 | 12/2006 | | |
| WO | 2007/067313 | 6/2007 | | |

OTHER PUBLICATIONS

Fu et al., "Characterization of focused ion beam induced deposition process and parameters calibration," Sensors and Actuators, 88(1):58-66, 2001.

"An Introduction to the Helium Ion Microscope" (Materials Research Society Meeting, Nov. 2006).

Bell, A.E. et al., "High-field ion sources", Rev. Sci. Instrum. 61(1): 363-365 (1990).

Bernatskii and Pavlov, "Field Desorption of a Potassium—Gold Film on Tungsten," Physics of the Solid State, 46(8):1538-1541, 2004.

Binh, V.T. "In situ fabrication and regeneration of microtips for scanning tunneling microscopy", J. Microscopy 152(2): 355-361 (1988).

Boerret et al., "Long time current stability of a gas filed ion source with a supertip," J. Phys. D. Appl. Phys. 21(12):1835-1837, 1988.

Breese et al., "Ion optical study of a transmission ion microscope," Nuclear instruments & Methods in Physics Research, Section-B: Beam Interactions with Materials and Atoms, Elsevier, Amsterdam, NL, vol. 158, No. 1-4, Sep. 2, 1999, pp. 236-240.

Brune et al., "Surface migration of "hot" adatoms in the course of dissociative chemisorption of oxygen on Al(111)," Phys. Rev. Lett. 68, Issue 5-3 Feb. 1992, pp. 624-626.

Bunday et al., "Determination of optimal parameters for CD-SEM measurement of line-edge roughness," Metrology, Inspection, and Process Control for Microlithography XVIII, Proceedings of SPIE—The International Society for Optical Engineering, vol. 5375, pp. 515-533, May 24, 2004.

Butz et al., "From Micro- to Nanoprobes: Auspices and Horizons," Nuclear Intruments & Methods in Physics Research, Section-B: Beam Interactions with Materials and Atoms, Elsevier, Amsterdam, NL, vol. 113, No. 1, Jun. 1996, pp. 317-322.

Chanson et al., "Sur les premieres images obtenues avec un microscope protonique," Comptes Rendus Hebdomadaires des Seances de l'Academie des Sciences France, vol. 233, Dec. 3, 1951, pp. 1436-1438.

Edinger, K. et al., "Development of a high brightness gas field ion source", J. Vac. Sci. Technol. B 15(6): 2365-2368 (1997).

Escovitz et al., "Scanning Transmission Ion Microscope with a Field Ion Source," Feb. 24, 1975, Proceedings of the National Academy of the Sciences, vol. 72, No. 5, Published May 1975, pp. 1826-1828.

Fink et al., "Atomic Resolution in Lensless Low-energy Electron Holography," Phys. Rev. Lett. 67, Issue 12-16 Sep. 1991, pp. 1543-1546.

Fink et al., "Coherent point source electron beams," Journal of Vacuum Science & Technology B: Microelectronics and Nanometer Structures, Nov. 1990, vol. 8, Issue 6, pp. 1323-1324.

Fink et al., "Lattice Steps and Adatom Binding on Tungsten (211)," Surf. Sci., vol. 143, No. 1, pp. 125-144, Jul. 1984.

Fink, H.-W. et al., "Electron and Ion Microscopy Without Lenses", Nanostructures and Quantum Effects (Springer-Verlag, 1994), pp. 17-27.

Fink, H.-W., "Mono-atomic tips for scanning tunneling microscopy", IBM J. Res. Develop. 30: 460-465 (1986).

(56) References Cited

OTHER PUBLICATIONS

Fink, H.-W., "Point Source for Ions and Electrons", Physica Scripta 38: 260-263 (1988).

Fotino, M., "Tip sharpening by normal and reverse electrochemical etching", Rev. Sci. Instrum. 64(1): 159-167 (1993).

Fu, T.-Y. et al., "Method of creating a Pd-covered single-atom sharp W pyramidal tip: Mechanism and energetics of its formation", Phys. Rev. B 64: 113401-1-4 (2001).

Giannuzzi and Stevie, *Introduction to Focused Ion Beams—Instrumentation, Theory, Techniques and Practice*, Nov. 2004, Springer, XP002442742, Chapter 3, see especially p. 56, second section.

Giannuzzi and Stevie, *Introduction to Focused Ion Beams—Instrumentation, Theory, Techniques and Practice*, Nov. 2004, Springer, XP002462691, Chapter 5—Device Edits and Modifications.

Golubev et al., "Field Emission Study of the Growth of Close-Packed and Stepped Surfaces of a Tungsten Single Crystal," J. Crystal Growth 52:48-52, 1981.

Grivet et al., "Ion Microscopy: History and Actual Trends," Ann NY Acad Sci, 1978 NY Acad of Sci, vol. 306, Feb. 23, 1977, pp. 158-182.

Hill, R. et al., "The ALIS He Ion Source and its Application to High Resolution Microscopy" (Seventh International Conference on Charged Particle Optics, Jul. 2006).

Hiroshima et al., "A focused He+ ion beam with a high angular current density," Jpn. J. Appl Phys., 31(1)(12B):4492-4495, 1992.

Hong-Shi et al., "Preparation and characterization of single-atom tips," Nano Letters, vol. 4, No. 12, pp. 2379-2382, Dec. 2004.

Horch, S. et al., "Field emission from atomic size sources", J. Appl. Phys. 74(6): 3652-3657 (1993).

Horiuchi, K. et al., "Emission characteristics and stability of a helium field ion source", J. Vac. Sci. Technol. B. 6(3): 937-940 (1988).

Itakura et al., "Focusing Column For Helium Field Ion Source," Microelectric Engineering, Elsevier Publishers BV., Amsterdam, NL, vol. 3, No. 1-4, pp. 153-160, Sep. 23, 1985.

Itakura et al., "Microprobe of Helium Ions," Journal of Vacuum Science and Technology: Part B, AVS / AIP, Melville, New York, NY, vol. 9, No. 5, pp. 2596-2601, Sep. 1, 1991.

Jaksic et al., "New Developments in IBIC for the Study of Change Transport Properties of Radiation Detector Materials," Nuclear Instruments & Methods in Physics Research, Section-B: Beam Interactions with Materials and Atoms, Elsevier, Amsterdam, NL, vol. 158, No. 1-4, Sep. 2, 1999, pp. 458-463.

K. Jousten et al. "Growth & Current Charities of a Stable field Ion Emitter," Ultramicroscope 26, pp. 301-312 (1988).

Kalbitzer et al., "High-brightness source for ion and electron beams (invited)," Review of Scientific Instruments, American Institute of Physics, vol. 69, No. 2, pp. 1026-1031, Feb. 2, 1998.

Kalbitzer et al., "Ion beam modification for submicron technology," Nuclear Instruments & Methods in Physics Research, Section-B: Beam Interactions With Materials and Atoms, Elsevier, Amsterdam, NL, vol. 113, No. 1, pp. 154-160, Jun. 1996.

Kalbitzer et al., "Multipurpose nanobeam source with supertip emitter," Journal of Vacuum Science & Technology B: Microelectronics Processing and Phenomena, American Vacuum Society, vol. 16, No. 4, pp. 2455-2461, Jul. 1998.

Kalbitzer, "Bright ion beams for the nuclear microprobe," Nuclear Instruments & Methods in Physics Research, Section-B: Beam Interactions With Materials and Atoms, Elsevier, Amsterdam, NL., vol. 158, No. 1-4, pp. 53-60, Sep. 2, 1999.

Kim et al., "Effects of low-energy (1-1.5 kV) nitrogen-ion bombardment on sharply pointed tips: Sputtering, implantation, and metal-nitride formation," Journal of Applied Physics, American Institute of Physics, vol. 81, No. 2, p. 944, Jan. 15, 1997.

Knoll et al., "Das Elektronenmikroskop" Zeitshrift fur Physik Germany, vol. 78, No. 5-6, Oct. 4, 1932, pp. 318-339.

Kubena et al., "A low magnification focused ion beam system with 8 nm spot size," J. Vac. Sci. Technol., 9(6):3079-3083, 1991.

Kuo et al., "Noble Metal/W(111) Single-Atom Tips and Their Field Electron and Ion Emission Characteristics," Jpn. J. App. Phy., 45(11):8972-8983, 2006.

Levi-Setti, "High Resolution Scanning Ion Probes: Application to Physics and Biology," Nuclear Instruments and Methods, North-Holland, vol. 168, No. 1-3, pp. 139-149, Jun. 25, 1979.

Levi-Setti, "Proton Scanning Microscopy: Feasiblity and Promise," Scanning Electron Microscopy. Proceedings of the Annual Scanning Electron Microscope Symposium, Chicago, IL., pp. 125-134, Apr. 11, 1974.

Liu and Orloff, "Analytical model of a gas phase filed ionization source," J. Vac. Sci. Technol. B 23(6):2816-2820, 2005.

Liu et al., "A Study of Optical Properties of Gas Phase Field Ionization Sources," Advances in Imagin and Electron Physics, Elsevier Academic Press, vol. 138, pp. 147-175, Oct. 2005.

Lucier, A.-S., "Preparation and Characterization of Tungsten Tips Suitable for Molecular Electronics Studies", excerpts from MSc Thesis, McGill University, 2004.

Magnan, "The Proton Microscope," Nucleonics, vol. 4, No. 4, Apr. 1949, pp. 52-66.

McGuinness, P.E., "Seeing at Atomic Resolution is Believing: Welcome the Helium Ion Microscope", Scanning 27(6): 323 (2005).

Melngailis, "Focused ion beam Lithography", Nuclear Instr. And Methods in Phys. Res. B80(81):1271-1280, 1993.

Melngailis, "Ion Sources for Nanofabrication & High Resolution Lithography," IEEE Proceedings of the 2001 Particle Accelerator Conference, Chicago, Illinois, (2002).

Melngailis, J., "Focused ion beam technology and applications", J. Vac. Sci. Technol. B 5(2): 469-495 (1987).

Morgan, J. et al., "An Introduction to the Helium Ion Microscope" (Microscopy Today, Jul. 2006).

Muller, H.U. et al., "Emission properties of electron point sources", Ultramicroscopy 50: 57-64 (1993).

Mutsaers, "Nuclear Microprobe Design," Nuclear Instruments & Methods in Physics Research, Section—B: Beam Interactions with Materials and Atoms, Elsevier, Amsterdam, NL, vol. 113, No. 1, Jun. 1996, pp. 323-329.

Notte, J. et al., "An Introduction to Helium Ion Microscopy" (Microscopy and Micro-Analysis, Jul. 2006).

Notte, J. et al., "Sample Interaction and Contrast Mechanisms of the Helium Ion Microscope" (Scanning Conference, Apr. 2006).

Notte, J.A. et al., "An Introduction to Helium Ion Microscopy and its Nanotechnology Applications" (NanoScience and Technology Institute, May 2006).

Nova 600 Nanolab Product Data, Fei Company Product Data, 2003, XP007903648.

Orloff et al., "A Scanning Ion Microscope with a Field Ionization Source," Scanning Electron Microscopy. Proceedings of the Annual Scanning Electron Microscope Symposium, Chicago, IL, No. 10, pp. 57-62, Mar. 1977.

Orloff et al., "High-Resolution Focused Ion Beams: FIB and its Applications," Kluwer Academic / Plenum Publishers, New York, Chapter 6.8, (2003).

Orloff, "High-Resolution Focused Ion Beams," Review of Scientific Instruments, AIP, vol. 64, No. 5, pp. 1106-1107, May 1, 1993.

Pavlov, "Atomically Sharp <111> Trihedral Angle of a Tungsten Tip," Physics of a Solid State, 49(8):1579-1582, 2007.

Pavlov, "Field Desorption Microscopy of the <111> Trihedral Angle of a Reconstructed Tungsten Tip," Technical Physics, 51(9):1210-1214, 2006.

Pavlov, "Field-Desorption Microscopy Study of the Deformation of a Tungsten Tip Subjected to Thermal Treatment in an Electric Field," Physics of the Solid State, 47(11):2180-2185, 2005.

Pavlov, "Observation of the Drawing out of Needles by Electric Fields," A translation of JETP Pis'ma v Redaktsiyu of the Academy of Sciences of the USSR, 17(5):177-179, 1973.

Pavlov, "Variations in Shapes of Outgrowths on a Tungsten Tip during Growth in an Electric Field," Physics of a Solid State, 48(5):969-972, 2006.

Purcell et al., "Characterization of atomic-size metal ion sources," Journal of Vacuum Science & Technology B: Microelectronics and Nanometer Structures, Jan. 2001, vol. 19, Issue 1, pp. 79-86.

Qing Ji, "Maskless, Resistless Ion Beam Lithography Process," Ph.D. Dissertation, Department of Electrical Engineering and Computer Sciences, UCAL Berkeley (2003).

(56) References Cited

OTHER PUBLICATIONS

Rezeq, M. et al., "Sharpening of a Field of Ion Microscope (FIM) Tungsten Tip by the Controlled Interaction of Nitrogen with the Tip Surface Atoms," Abstract from APS Mar. Meeting (2004).
Russell P.E. et al., "Chemically and geometrically enhanced focused ion beam micromachining," Journal of Vacuum Science and Technology B, vol. 16, No. 4, Jul./Aug. 1998, 2494-2498.
Sakai et al., "Contrast mechanisms in scanning ion microscope imaging for metals," App. Phys. Letters, AIP, vol. 73, No. 5, pp. 611-613, Aug. 3, 1998.
Sakata et al., "Helium field ion source for application in a 100 keV focused ion beam system," J. Vac. Sci. Technol. B 10(6):2842-2845, 1992.
Schmid et al., "In-line holography using low-energy electrons and photons: Applications for manipulation on a nanometer scale," Journal of Vacuum Science & Technology B: Microelectronics and Nanometer Structures, Nov. 1995, vol. 13, Issue 6, pp. 2428-2431.
Schmid et al., "Mechanical and electronic manipulation of nanometer-sized wires," Nanotechnology, vol. 5, pp. 26-32, 1994.
Schmid, H. et al., "Combined electron and ion projection microscopy", Appl. Surf. Sci. 67: 436-443 (1993).
Sendecki et al. "A scanning field emission microscope," Meas. Sci. Technol., 6(3):306-309, (1995).
Shrednik et al., "Growth of Tips in the Directions Normal to Close-Packed Faces by Heating in the Presence of an Electric Field," Phys. Stat. Sol. (a), 23(1):373-381, 1974.
Stevie et al., "Focused Ion Beam Gases for Deposition and Enhanced Etch," Chapter 3 of Introduction to Focused Ion Beams—Instrumentation, Theory, Techniques and Practice, Edited by Giannuzi et al., Published by Springer, pp. 53-72, (2005).
Stocker, W. et al., "Low-energy electron and ion projection microscopy", Ultramicroscopy 31: 379-384 (1989).
Thompson et al., "Towards a commercial gas field ion source," Proceedings of SPIE, vol. 2437. (1995).
Tondare et al., "The concept of a high-brightness, miniaturized gas field ion source," Vacuum Microelectronics Conference, 2003. Technical Digest of the 16th International IEEE, pp. 307-308, Jul. 7, 2003.
Tondare V. N., "Quest for high brightness, monochromatic noble gas ion sources," J.Vac.Sci.Technol., A 23, 1498 (2005).
Unger et al., "Probe hole field electron/field ion microscopy and energy spectroscopy of ultrasharp [111]-oriented tungsten tips," Applied Surface Science 87(88):45-52, 1995.
Valdiviez et al., "The mechanical design of a proton microscope for radiography at 800 MeV," Institute of Electrical and Electronics Engineers: Proceedings of the 2003 Particle Accelerator Conference. PAC 2003. Portland, OR, May 12-16, 2003, Particle Accelerator Conference, New York, NY: IEEE, US. vol. 1 of 5, May 12, 2003.
Vlasov et al., "High-temperature filed evaporation of thermofield microscopic protuberances," Sov. Tech. Phys. Lett. 12(5):224-225, 1986.
Ward et al., "Focused Ion Beam Induced Optical Emission Spectroscopy," J. Vac. Sci. Technol. 6(6):2100-2103, 1988.
Ward et al., "The Helium Ion Microscope: A New Tool for Nanoscale Microscopy and Metrology" (Electron, Ion, and Photon Beam Nanotechnology Conference, May 2006).
Wengelnik, H. et al., "Oxygen-induced sharpening process of W(111) tips for scanning tunneling microscope use," J. Vac. Sci. Technol. A 8(1): 438-440 (1990).
Wilbertz et al., "Recent Progress in gas field ion source technology," Proceeding of SPIE, vol. 2194. (1994).
Wolf et al., "Design and performance of a scanning probe-hole field emission microscope," Surface Science, vol. 246, No. 1-3, pp. 420-427, Apr. 1991.
Breguet and Clavel, "Stick and Slip Actuators: design, control, performances and applications," Micromechatronics and Human Science, Proceedings of the 1998 International Symposium, 89-95, 1998.
Fu et al., "Microfabrication of microlens array by focused ion beam technology," Microelectronic Engineering, 54(3-4):211-221, 2000.
Liu and Wang, "A self-moving precision positioning stage utilizing impact force of spring-mounted piezoelectric actuator," Sensors and Actuators, 102(1-2):83-92, 2002.
Nomura et al., "Application of Electromagnetic Actuator using Rubber Film to Three-Degrees-of-Freedom Precision Stage," Advanced Intelligent Mechatronics (AIM 2003), 101-106, 2003.
Orloff et al., "High Resolution Focused Ion Beams: FIB and its Applications," Review of Scientific Instruments, 136-145, 2003.
Orloff et al, "Fundamental limits to imaging resolution for focused ion beams," J. Vacuum Science & Tech., 14(6):3759-3763, 1996.
Versteyhe et al., "A rigid and accurate piezo-stepper based on smooth learning hybrid force-position controlled clamping," Proceedings of the 1998 IEEE International Conference on Robotics & Automation, 4:3059-3064, 1998.
Doyle et al., "A new approach to nuclear microscopy: the ion-electron emission microscope," Nuclear Instruments & Methods in Physics Research B 158 (1999) pp. 6-17.
Hanson et al., "H2 and rare gas field ion source with high angular current," J Vacuum Science and Technology, 16(6) Nov./Dec. 1979, pp. 1875-1878.
Marquardt et al., "Cryogenic Material Properties Database," $11^{th}$ International Cryocooler Conference, Jun. 20-22, 2000, Keystone, CO.
Tomaru et al., "Thermal lensing in an cryogenic sapphire substrates," Class. Quantum Grav. 19 (2002), pp. 2045-2049.
Reyntjens and Puers, "A review of focused ion beam applications in microsystem technology," J. Micromech. Microeng., 11(4):287-300, 2001.
Li and Rau, "Magnetic domain structures of focused ion beam-patterned cobalt films using scanning ion microscopy with polarization analysis," 95(11):6527-6529, (2004).
Gignac et al., "Imaging and analysis of subsurface Cu interconnects by detecting backscattered electrons in the scanning electron microscope," J. Appl. Phys., 97(114506):1-9, 2005.
Giannuzzi et al., Introduction to Focused Ion Beams, Instrumentation, Theory, Techniques and Practice, Jan. 2005, Springer, pp. 249-261.
Giannuzzi et al., Introduction to Focused Ion Beams, Instrumentation, Theory, Techniques and Practice, Jan. 2005, Springer, XP002540689, pp. 276-280, 281.
Prewett et al., "Microcircuit machining using focused ion beams—a note on the role of SIMS for end point detection," Microelectronic Engineering, ElsevierPublishers, Sep. 1989, vol. 10, No. 1, pp. 1-9.

\* cited by examiner

SYSTEMS AND METHODS FOR A GAS FIELD IONIZATION SOURCE

CROSS REFERENCE TO RELATED APPLICATIONS

This application claims priority under 35 U.S.C. §120 to, and is a continuation-in-part of, U.S. Ser. No. 10/966,243, filed Oct. 15, 2004, which in turn claims priority under 35 U.S.C. §119 to U.S. Ser. No. 60/511,726, filed Oct. 16, 2003.

This application also claims priority under 35 U.S.C. §120 to, and is a continuation-in-part of, U.S. Ser. No. 11/385,136, filed Mar. 20, 2006, now abandoned.

FIELD OF INVENTION

This invention relates to an ion source and more particularly to an atomic level ion source (ALIS) generating ions from a volume near the size of a single atom.

BACKGROUND

Charged particle microscopes typically use electrons or metal ions. Both types of microscopes are moderately reliable, and the electron microscope provides very high resolution. However, helium ion microscopes have certain advantages over the electron microscope. Light ions significantly reduce the optical diffraction effects that electrons cause and they have a smaller interaction volume when focused onto the surface of a sample by a lens. Helium ions can also provide better chemical contrast than electrons. Furthermore, the Helium ion sources can be built smaller than electron sources, providing a smaller final spot size for a given optical condition. Typically, the coherence, or energy spread, of this type of ion source is better than electron sources minimizing chromatic aberration effects that cause resolution reduction. However, prior efforts to utilize ion sources for imaging applications haven proven to be unstable and unreliable.

There is a need for a reliable and bright ion source. Such a source incorporated into an ion electro-optical system will provide very high resolution pictures having near atom resolution.

SUMMARY OF THE INVENTION

The systems and methods described herein include an improved gas field ion source and improved methods for manufacturing, maintaining and enhancing the performance a gas field ion source. This application is related to U.S. patent application Ser. No. 10/966,243 filed on Oct. 15, 2004, Ser. No. 11/146,741 filed on Jun. 7, 2005, Ser. No. 11/147,102 filed on Jun. 7, 2005 and U.S. Provisional Application 60/741, 856 filed on Dec. 2, 2005. This application also relates to U.S. application Ser. No. 11/385,215, filed on Mar. 20, 2006, entitled "Systems and Methods for a Gas Field Ion Microscope." The entire contents of each of the above references are incorporated herein by reference.

In one aspect the invention provides a gas field ion source assembly that includes an ion source in connection with an optical column, such that an ion beam generated at the ion source travels through the optical column. The ion source includes an emitter having a width that tapers to a tip comprising a few atoms. In other aspects, the invention provides methods for manufacturing, maintaining and enhancing the performance of a gas field ion source including sharpening the tip of the ion source in situ.

More particularly, in one aspect the systems and methods described herein include an ion source. The ion source comprises an emitter with a distal end that tapers to an atomic shelf having a substantially constant predetermined number of atoms. The ion source includes a first gas source for delivering an imaging gas to a region near the distal end. The ion source also includes a voltage source in electrical connection with the emitter for generating an electric field near the distal end of the emitter, thereby generating a particle beam from a region near the atomic shelf of the emitter in a direction away from the distal end of the emitter. The ion source further comprises a second gas source for delivering a promoting gas. The promoting gas reacts with the emitter to shape the distal end and thereby keep the predetermined number of atoms in the atomic shelf substantially constant.

In one embodiment, the ion source comprises a tilting system coupled to the emitter, such that a longitudinal axis of the emitter is at angle from an axis of the particle beam. The particle beam may include at least one of an ion beam and an electron beam.

The distal end of the emitter may have a substantially conical shape. In one embodiment, the atomic shelf of the emitter comprises between one and twelve atoms. The atomic shelf may comprise about three atoms. The emitter may be formed from a crystalline conductive material. The crystalline conductive material may include Tungsten. Additionally and optionally, the tungsten may be oriented such that the <111> crystal plane is substantially aligned with a longitudinal axis of the emitter. The emitter may have a length between 750 μm and 5 mm and a diameter is between 50 μm and 1 mm.

In one embodiment, the ion source may comprise a base coupled to a proximal end of the emitter. In such an embodiment, the ion source may also comprise at least one post rigidly attached to a portion of the base. The ion source may further comprise a heating element having a distal end and a proximal end, such that the distal end of the heating element is rigidly attached to a portion of the emitter and the proximal end of the heating element is attached to the at least one post. Additionally and optionally, the emitter may be rigidly attached to a plurality of heating elements. The heating element may have a length 1 mm and 10 mm and a thickness between 100 μm and 750 μm. The ion source may also include a reinforcement element attached to a portion of the base and the heating element.

In one embodiment, the ion source may comprise an optical column enclosing at least a portion of the emitter and oriented substantially parallel to a longitudinal axis such that the particle beam generated near the distal end of the emitter can travel within the optical column. The optical column may comprise a first field element capable of generating an electric field and a second field element capable of generating a magnetic field, such that the generated electric field and the magnetic field are transverse to each other. Additionally and optionally, the ion source may comprise a beam stop disposed in at least one location along the path of the ion beam. The optical column further comprises a plurality of first field elements and a plurality of second field elements. The optical column may comprise a gas including at least one of an imaging gas and a promoting gas. The imaging gas may include at least one of helium, neon, argon, krypton, xenon, hydrogen. The promoting gas may include at least one of nitrogen, hydrogen and oxygen.

In one embodiment, at least one of the first gas source and the second gas source comprises a nozzle capable of delivering a stream of gas to a portion of the distal end of the emitter. The nozzle may be pointed towards the distal end of the emitter. The nozzle may have a length greater than about 5 times the diameter of the nozzle.

In one embodiment, the ion source comprises a vacuum pump to remove at least one of the imaging gas and the promoting gas. The ion source may also comprise a light source capable of delivering light to a portion of the distal end of the emitter, such that adsorbed atoms are removed. The light source may include a laser In another aspect, systems and methods described herein include methods for operating an ion source. The methods may comprise the steps of providing an emitter having a distal end, such that the distal end tapers to an atomic shelf including a predetermined number of atoms and providing neutral gas atoms to a region near the distal end. The methods further comprise the steps of applying a voltage to the emitter such that the neutral gas atoms are ionized near the atomic shelf, and generating an ion beam, including the ionized gas atoms, from a region near the atomic shelf, in a direction away from the distal end. The methods additionally comprise the step of shaping the distal end, while operating the ion source, to keep the predetermined number of atoms in the atomic shelf substantially constant.

In one embodiment, the method comprises the step of changing the path of the ion beam by generating an electric field and a magnetic field transverse to each other in at least one location along a path of the ion beam. In such an embodiment, the path may be predetermined. The method further comprises the step of guiding the ion beam along the predetermined path by generating a plurality of electric fields and magnetic fields at predetermined locations along the path. Additionally and optionally, the method includes the step of capturing a portion of the neutral gas atoms by placing a beam stop in at least one location along the path of the ion beam.

In another aspect, the systems and methods described herein include methods for maintaining an ion source. The methods may comprise the steps of providing an ion source with an emitter having a distal end, such that the distal end tapers to an atomic shelf, and providing a gas to a region near the distal end of the emitter. The methods further comprise the step of sharpening the ion source in situ by reacting a portion of the gas with the distal end of the emitter, such that a portion of the distal end of the emitter is removed and a width of the distal end of the emitter is reduced in a region surrounding the atomic shelf.

In one embodiment, the step of sharpening the ion source may include applying a voltage to the ion source, such that another portion of the gas ionizes in a region near the atomic shelf of the emitter and prevents the atomic shelf from being removed. The gas comprises a field-sensitive gas including nitrogen. The rate of reaction between the gas and the distal end of the emitter may be determined based at least in part on crystallographic planes.

In one aspect, the systems and methods described herein include methods for maintaining an ion source. The methods may comprise the steps of providing an ion source with an emitter having a distal end including a crystal structure, such that the distal end tapers to an atomic shelf and shaping the ion source in situ by rearranging that the crystal structure of a portion of the distal end of the emitter.

In one embodiment, the crystal structure may be rearranged by at least increasing the temperature of the emitter and thereby increasing the mobility of atoms near the atomic shelf. The crystal structure may also be rearranged by applying a voltage to the emitter. In certain embodiments, the crystal structure may be rearranged in the presence of adsorbed atoms near the distal end of the emitter. In such embodiments, the adsorbed atoms may include at least one of oxygen, palladium and platinum. The adsorbed atoms may accelerate the rearrangement of the crystal structure.

In one aspect, the systems and methods described herein include methods for manufacturing an ion source. The methods comprise the steps of providing an emitter having a proximal end and a distal end, such that the distal end tapers to an atomic shelf, coupling a base to the proximal end of the emitter and enclosing the base and the emitter in an optical column. The method also comprises the steps of connecting a gas source for providing a gas to a region of the emitter near the distal end, and connecting a voltage source to the emitter for generating an electric field near the distal end of the emitter, such that the gas ionizes in the region near the distal end of the emitter. The method further comprises the step of sharpening the ion source by reacting a portion of the gas with the distal end of the emitter, such that a portion of the distal end of the emitter is removed and a thickness of the distal end of the emitter is reduced in a region away from the atomic shelf.

In another aspect, the systems and methods described herein include methods for manufacturing an ion source. The methods comprise the steps of providing an emitter having a proximal end and a distal end including a crystal structure, such that the distal end tapers to an atomic shelf, coupling a base to the proximal end of the emitter and enclosing the base and the emitter in an optical column. The methods further comprise the steps of connecting a gas source to provide a gas, such that the gas reacts with the emitter near the distal end, and shaping the ion source by rearranging that the crystal structure of a portion of the distal end of the emitter.

In one aspect, the systems and methods described herein include methods for manufacturing an electron source. The methods comprise the steps of providing an emitter having a proximal end and a distal end, such that the distal end tapers to an atomic shelf, coupling a base to the proximal end of the emitter and enclosing the base and the emitter in an optical column. The method also comprises the steps of connecting a gas source for providing a gas to a region of the emitter near the distal end, and connecting a voltage source to the emitter for generating an electric field near the distal end of the emitter, such that electrons are emitted from a region near the distal end of the emitter. The method further comprises the step of sharpening the electron source by reacting a portion of the gas with the distal end of the emitter, such that a portion of the distal end of the emitter is removed and a thickness of the distal end of the emitter is reduced in a region away from the atomic shelf.

In another aspect, the systems and methods described herein include methods for manufacturing an electron source. The methods comprise the steps of providing an emitter having a proximal end and a distal end including a crystal structure, such that the distal end tapers to an atomic shelf, coupling a base to the proximal end of the emitter and enclosing the base and the emitter in an optical column. The methods further comprise the steps of connecting a gas source to provide a gas, such that the gas reacts with the emitter near the distal end, and shaping the electron source by rearranging that the crystal structure of a portion of the distal end of the emitter.

BRIEF DESCRIPTION OF THE DRAWINGS

The following figures depict certain illustrative embodiments of the invention in which like reference numerals refer to like elements. These depicted embodiments may not be drawn to scale and are to be understood as illustrative of the invention and not as limiting in any way.

DESCRIPTION OF CERTAIN ILLUSTRATED EMBODIMENTS

There are other aspects and embodiments of the systems and methods of the invention will be described more fully by referring to the figures provided.

The systems and methods described herein will now be described with reference to certain illustrative embodiments. However, the invention is not to be limited to these illustrated embodiments which are provided merely for the purpose of describing the systems and methods of the invention and are not to be understood as limiting in anyway.

As will be seen from the following description, in one aspect the invention provides a gas field ion source assembly that includes an ion source in connection with an optical column, such that an ion beam generated at the ion source travels through the optical column. The ion source includes an emitter having a width that tapers to a tip comprising a few atoms. In other aspects, the invention provides methods for manufacturing, maintaining and enhancing the performance of a gas field ion source including sharpening the tip of the ion source in situ.

Figure 1:
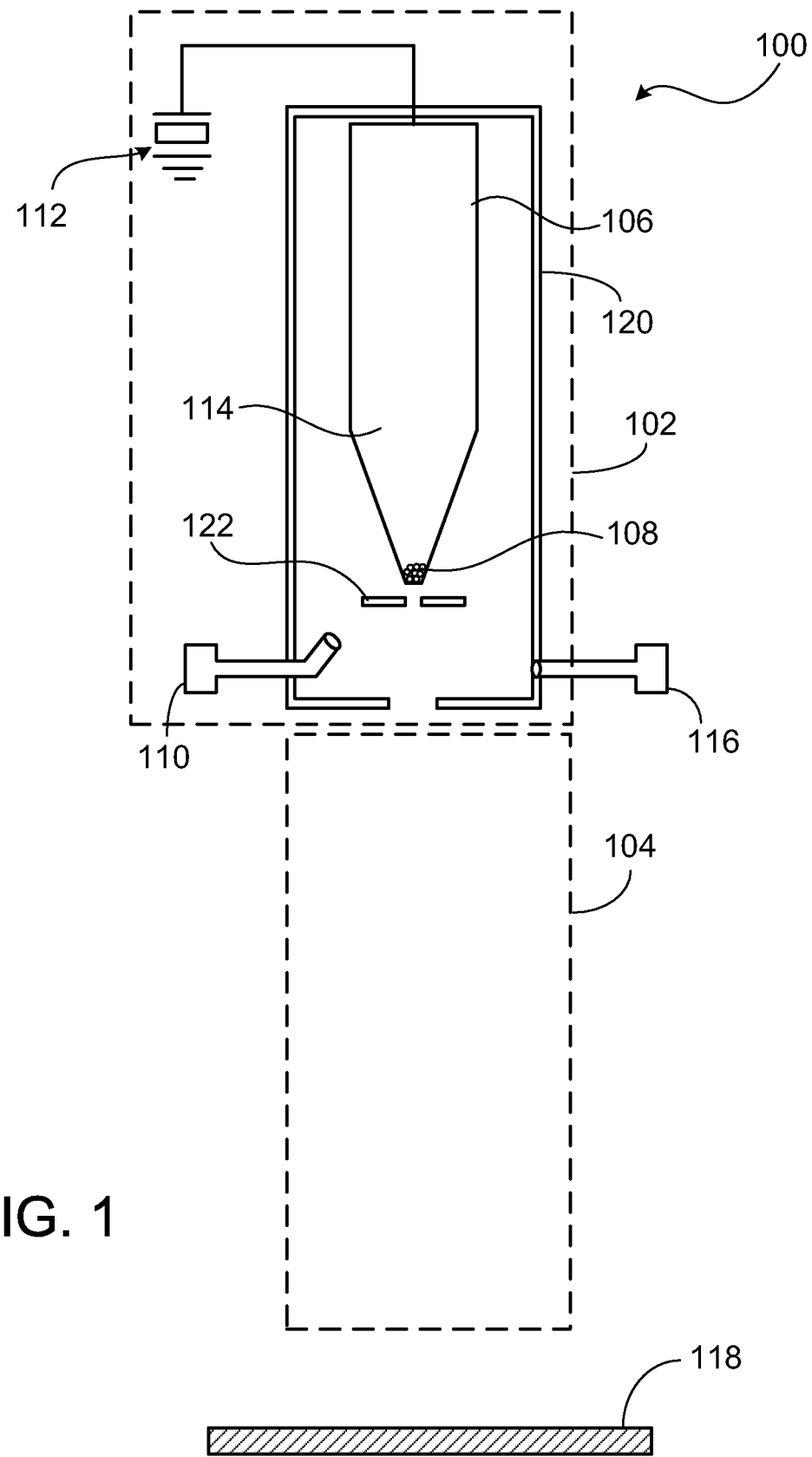
FIG. 1 depicts an ion source assembly including an ion source and an optical column, according to one illustrative embodiment of the invention.

FIG. 1 depicts an ion source assembly 100 including an ion source 102 and an optical column 104. The ion source 102 comprises an emitter 106 with a tapered distal end 114 and enclosed in a housing 120. The distal end 114 tapers to a tip 108 having an atomic shelf. The ion source also includes an extractor electrode 122. The emitter 106 is electrically connected to a voltage source 112. The ion source 102 also includes a gas source 110 and a vacuum pump 116. The ion source 102 is disposed adjacent to an optical column 104. The assembly 100 is disposed adjacent to a sample 118. During operation, the gas source delivers neutral gas atoms of an imaging gas to a region near the tip 108. The imaging gas atoms are ionized and are accelerated away from the emitter 106. The ionized imaging gas atoms constitute an ion beam. This ion beam generated near the distal end 114 of the emitter 106 travels through the length of the optical column 104 towards the sample 118.

In one embodiment, the emitter 106 includes a sharpened piece of wire of a single crystal material. In such an embodiment the emitter 106 may be formed from single-crystal tungsten. The emitter 106 may also be formed from other suitable crystalline materials without departing from the scope of the invention. The emitter 106 typically has a length from about 750 µm to about 5 mm. In one example, the length of the emitter 106 is chosen to be from about 1.5 mm to about 2 mm. The width of the emitter 106 near its widest portion is typically from about 50 µm to about 1 mm. In one example, the width of the emitter 106 near its widest portion is chosen to be about 250 µm.

The distal end 114 of the emitter 106 may have a substantially conical shape and tapers to a tip 108 having an atomic shelf. The atomic shelf includes a set of atoms arranged according to a crystallographic structure of the surface of the distal end 114 of the emitter 106. The crystallographic structure of the distal end 114 may be defined by the orientation of the crystal planes near the tip 108. The number of atoms in the atomic shelf may range from about one atom to about twelve atoms. In one embodiment, the emitter 106 is oriented such that the <111> crystal plane is substantially aligned with a longitudinal axis of the emitter 106. The longitudinal axis of the emitter may be a vertical axis that is substantially aligned with the length of the emitter 106. In other embodiments, the emitter 106 may be oriented to align other crystal planes such as <121>, <211>, <112>, <100> and <110> along the longitudinal axis without departing from the scope of the invention.

The emitter 106 is also typically formed from a suitable conductive material such that in response to applying a voltage to it, an electric field is generated around the distal end 114. The emitter 106 is connected to a voltage source 112 having operating voltages sufficient to generate an electric field of about 2 V/Angstrom at the tip 108. In one embodiment, the operating voltage may be about 10 kV. In certain embodiments, the voltage source may have operating voltages from about 1 kV to about 100 kV depending on the emitter 106 geometry. The voltage source 112 may be a suitable DC source according to specific needs of the application. In one embodiment, the tapered shape of the distal end 114 of the emitter 106 is responsible, at least in part, for the electric field to be higher in the vicinity of the distal end 114 and particularly near the tip 108. Generally, the electric field intensity is high at sharp points and the depicted systems describe the tip 108 of the emitter having a countable number of atoms. The system allows for the generation of very high electric fields in the region near the atomic scale tip 108.

In addition to the emitter 106 and the voltage source 112, the ion source 102 also includes a gas source 110 and a vacuum pump 116. The gas source 110 includes a connection to a source of imaging gas. The imaging gas may include at least one of helium, neon, argon, krypton, xenon and hydrogen. The gas source 110 includes a nozzle oriented such that the imaging gas may be delivered substantially to a region near the tip 108 of the emitter 106. In one embodiment, the gas source includes a nozzle having a length about 5 times greater than the diameter. Such an embodiment allows for gas to be delivered to a desired location with minimal spread. In certain embodiments, the nozzle may be connected to a plurality of gas sources for delivering an imaging gas and a promoting gas to a region near the distal end 114 of the emitter. The gas source 110 may include valves, timers, gauges, pressure regulators and other suitable control systems to monitor and control the gas pressure near the distal end 114 of the emitter. The vacuum pump 116 may be connected to remove excess gas atoms from the region near the emitter 106. The vacuum pump 116 may be a turbo pump or an ion pump connected through a vacuum hose to the interior of the housing 120. The housing 120 is typically formed from rigid, electrically conductive materials such as metals. In one embodiment, the housing 120 may be connected to an electrical ground, thereby establishing a voltage difference between the tip 108 of the emitter 106. In another embodiment, an extractor electrode 122 may be connected to an electrical ground, thereby establishing a voltage difference between the tip 108 of the emitter 106.

The extractor electrode 122 may be formed from an electrically conducting material such as copper. In one embodiment, the extractor electrode may be disc shaped and located in a position near the tip 108 of emitter 106. In such an embodiment, the disc shaped extractor electrode may have a diameter of about 6 inches and may be located in a position about 2 mm below the tip 108 of emitter 106. The extractor electrode 122 may have different shapes and dimensions and may be position in a different locations without departing from the scope of the invention.

Figure 2:
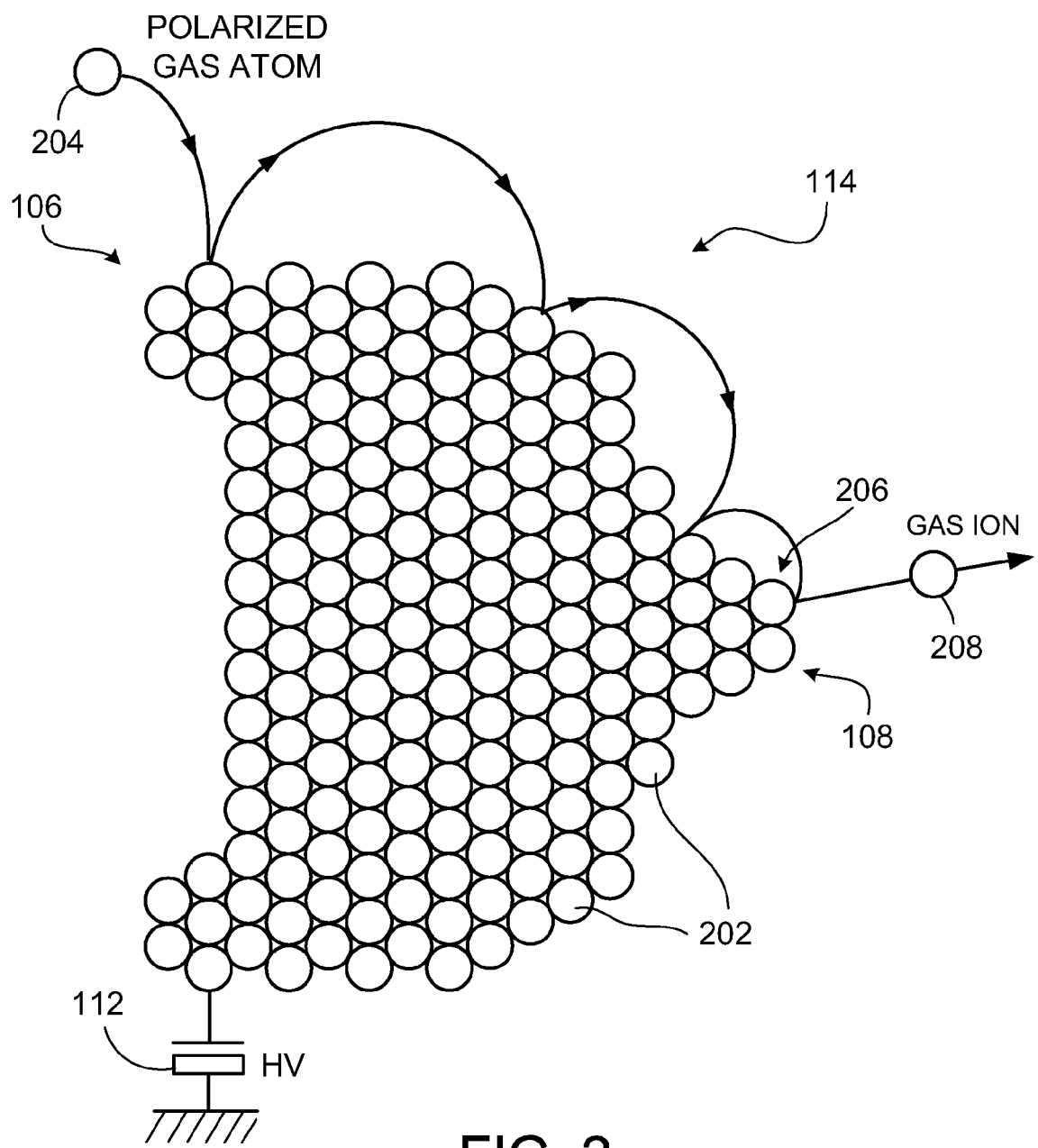
FIG. 2 depicts a two-dimensional atomic level view of the tip of the ion source of FIG. 1, according to one illustrative embodiment.

FIG. 2 depicts a two-dimensional atomic level view of the distal end 114 of the emitter 106 in FIG. 1 according to one illustrative embodiment. In particular, FIG. 2 depicts the formation of the ion beam near the tip 108 of the emitter 106. The emitter 106 is connected to a voltage source 112. A positive potential applied by the voltage source 112 generates an electric field in a region around the emitter 106. The intensity of the electric field is generally higher near the tip 108 of the emitter 106. The distal end 114 of the emitter 106 is shown in FIG. 2 as having atoms 202 arranged in atomic shelves. The atomic shelves in the distal direction towards the tip 108 have fewer atoms 202 than the shelves away from the tip 108. The intensity of the electric field generated in response to a voltage applied by the voltage source 112 is generally higher near atomic shelf 206 located near the tip 108.

During operation, a gas source 110 of FIG. 1 may deliver imaging gas atoms to a region near the distal end 114 of the emitter. These imaging gas atoms may become polarized due to the electric field in the vicinity of the emitter 106. The polarized gas atoms 204 accelerate towards the surface of the emitter wherein they become ionized. Ionized gas atoms ("gas ions"), in response to a repulsive electric field, leave the emitter 106 near the tip 108 as a gas ion 208. More specifically, the polarized gas atoms 204 accelerate toward the emitter 106 surface with high kinetic energies. Such high energy polarized atoms 204 bounce on the surface of the emitter 106 (random hopping) until their kinetic energy is lowered. With a lowered kinetic energy, the polarized gas atoms 204 tend to linger in a region near the tip 108 and have a higher probability of being ionized. In certain embodiments, the electric field is highest near the atomic shelf 206. The high electric field results in more neutral gas atoms becoming polarized and, thereby, increases the number of polarized gas atoms arriving at the tip 108 and getting ionized. In such embodiments, near the atomic shelf 206, gas ions also experience high repulsive forces. In one embodiment, the tip 108 may be cooled to help maintain structural integrity during operation. The tip 108 may be cooled to temperature of around −200° C. In another embodiment, the imaging gas may also be cooled prior to being delivered to the region near the distal end 114 of the emitter. In such an embodiment, the imaging gas may be cooled to a temperature of about −200° C.

Figure 3:
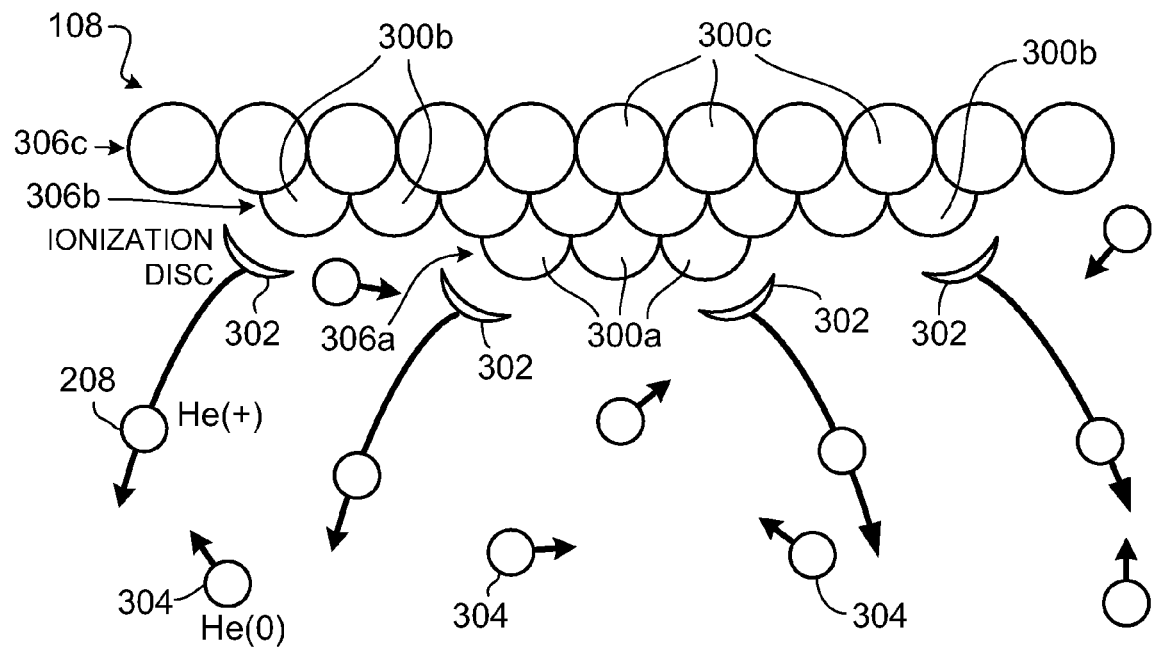
FIG. 3 depicts an enlarged view of the tip of the ion source of FIGS. 1 and 2.

FIG. 3 depicts a zoomed-in view of the tip 108 of an emitter 106 in FIGS. 1 and 2 according to one illustrative embodiment of the invention. The tip 108 includes one or more atomic shelves 306a, 306b and 306c (generally "atomic shelf 306"). Each atomic shelf 306a, 306b and 306c includes one or more atoms 300a, 300b and 300c (generally "atoms 300"), respectively. FIG. 3 shows neutral gas atoms 304 moving near the tip 108 and ionized gas atoms 208 moving in a direction away from the tip 108. A voltage applied to the emitter 106 generates an electric field such that the neutral gas atoms 304 get polarized and move towards tip 108. The polarized atoms (204, shown in FIG. 2) get ionized in an ionization disc 302 near the atoms 300 on an atomic shelf 306 and accelerate away from the tip 108.

The ionization disc 302 is typically a fairly narrow region above the surface of the emitter 106 where gas atoms can be ionized. Gas atoms 304 generally have a higher probability of getting ionized the longer the time they spend in the ionization disc 302. As discussed in FIG. 2, polarized gas atoms hop on the surface of the emitter 106 until their velocity is lowered and they spend more time lingering near the ionization disc 302.

In certain embodiments, the ionization disc may be about 0.4 nm above the surface of the atomic shelf 306. In such embodiments, the ionization disc may have a thickness of about 0.02 nm and width of about the diameter of an atom 300. The size and shape of the ionization disc 302 can be modified by, for example, changing the voltage applied to the emitter 106. In certain embodiments, the ionization discs 302 from adjacent atoms can overlap depending on the applied voltage. The emitter 106 in the ion source 102 may be assembled with other support elements to provide stability as well as connectivity to voltage sources and mechanical structural elements.

Figure 4A:
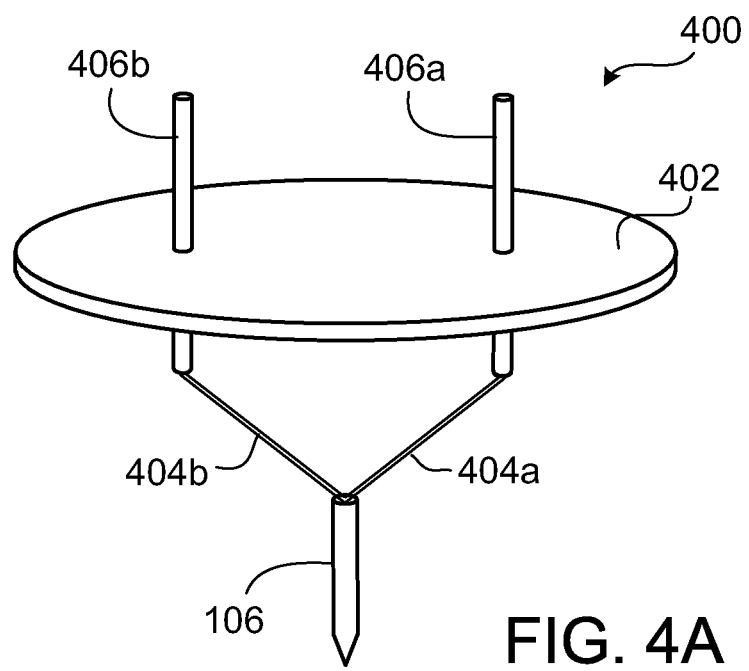
FIGS. 4A and 4B depict an emitter assembly according to one illustrative embodiment of the invention.
Figure 4B:
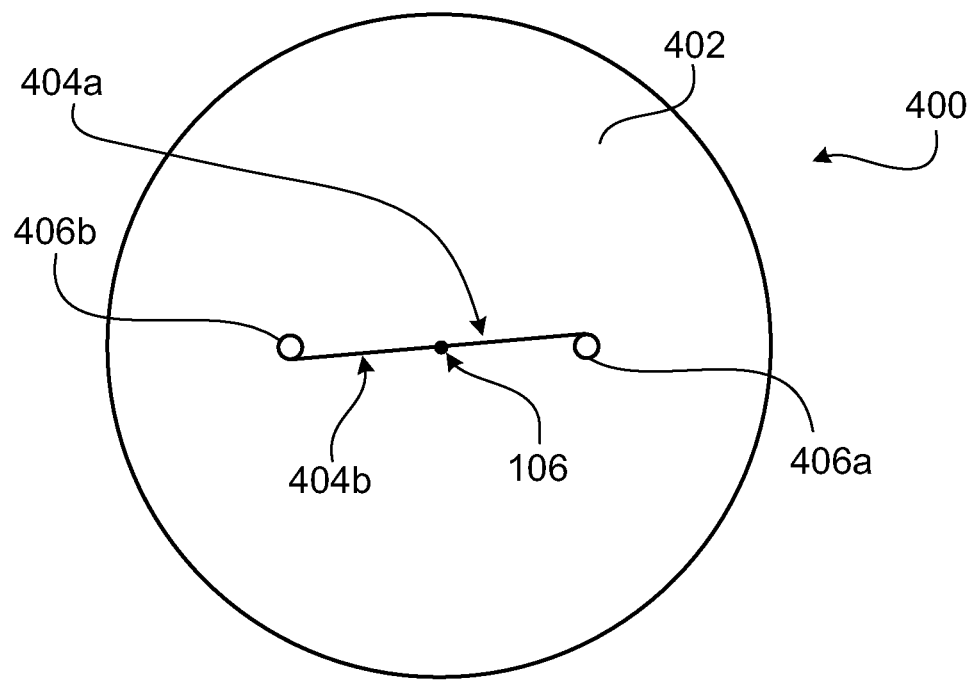

FIGS. 4A and 4B depict an emitter assembly 400 including an emitter 106 according to one illustrative embodiment of the invention. In particular, the emitter assembly 400 includes a base plate 402 having posts 406a and 406b (generally "post 406"). The posts 406a and 406b connect and secure the emitter 106 to the base plate 402. Posts 406a and 406b are connected to the emitter 106 through heater wires 404a and 404b (generally "heater wire 404"), respectively. The base plate 402 may be connected to mechanical devices suitable for operating the ion source 100 of FIG. 1. FIG. 4B depicts a top view of the emitter assembly 400. Heater wire 404a connects the emitter 106 to a lateral surface of the post 406a. Heater wire 404b connects the emitter 106 to a contra-lateral surface of the post 406b.

The base 402 provides rigid support for the emitter 106 and helps reduce vibration. The base 402 may be formed from materials capable of withstanding thermocycling through high and low temperatures. The base 402 typically includes electrically insulating material such as glass, rigid polymers and ceramic.

The post 406 may be formed from rigid electrically conducting materials such as KOVAR™. The post 406 is rigidly attached to the base 402 such that there is limited relative motion between them. The post 406 may be attached at any suitable location on the base depending on the needs of a particular application. The post 406 typically has a thermal expansion coefficient similar to that of the base 402.

The heater wire 404 may be used to adjust the temperature of the emitter 106. The heater wire 404 may be formed from material having higher resistivity than the emitter 106. The heater wire 404 may also include materials having high mechanical strength. Some suitable heater wire 404 materials include Tungsten and Tungsten-Rhenium alloys. The high resistivity heater wire 404 typically generates thermal energy when electric current is passed through them. The heater wire 404 provides thermal energy to heat the emitter 106 to high temperatures. The heater wire 404 is attached to the base through post 406. As shown in FIG. 4B, each heater wire 404 connects to an opposing surface of each post 406 to increase stability and reduce vibrations. In one embodiment, the length of the heater wire 404 is from about 1 mm to about 10 mm. In such an embodiment, the thickness of the heater wire 404 is from about 100 μm to about 750 μm.

Figure 4C:
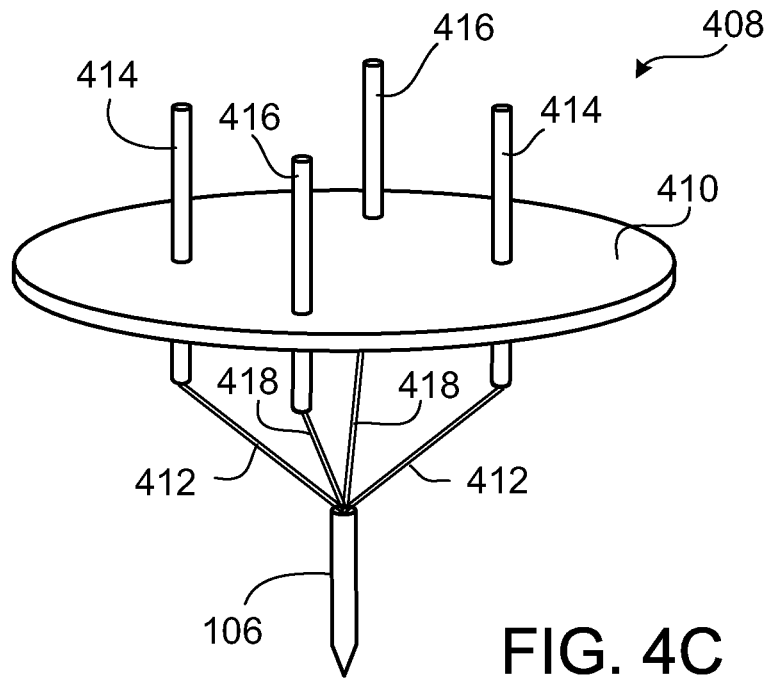
FIGS. 4C and 4D depict an emitter assembly according to another illustrative embodiment of the invention.
Figure 4D:
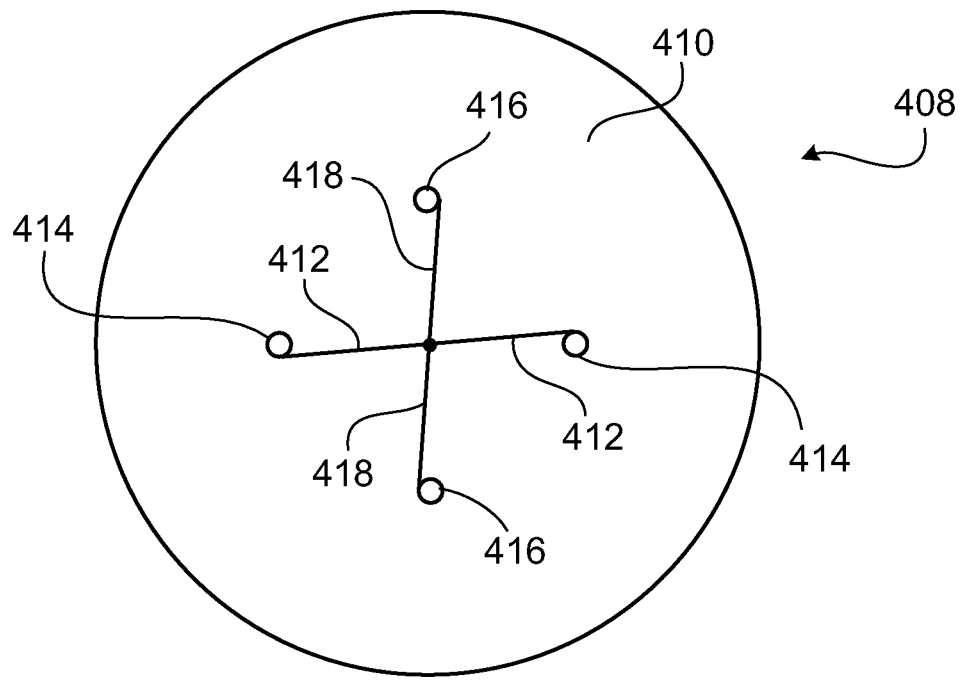

In certain embodiments, the emitter assembly includes three or more posts and heater wires to provide further support and reinforcement for the emitter 106. Such embodiments are shown in more detail in FIGS. 4C and 4D. More specifically, FIGS. 4C and 4D depict an emitter assembly 408 including an emitter 106 according to one illustrative embodiment of the invention. The emitter assembly 408 includes a base plate 410 having posts 414 and 416. The posts 414 and 416 connect and secure the emitter 106 to the base plate 410. Posts 414 and 416 are connected to the emitter 106 through heater wires 412 and 418. The base plate 410 may be connected to mechanical devices suitable for operating the ion source 100 of FIG. 1.

Posts 414 may be formed from materials similar to posts 406 in FIGS. 4A and 4B. Post 416 may be similar to Post 414. Post 416 may also be formed from rigid insulating materials including glass, rigid polymers or ceramics. Heater wire 412 may be formed from materials similar to heater wire 404 in FIGS. 4A and 4B. Heater wire 418 may be formed from any rigid material including insulating material. Post 416 and heater wire 418 may serve as additional re-enforcement for the emitter assembly 408

Figure 5:
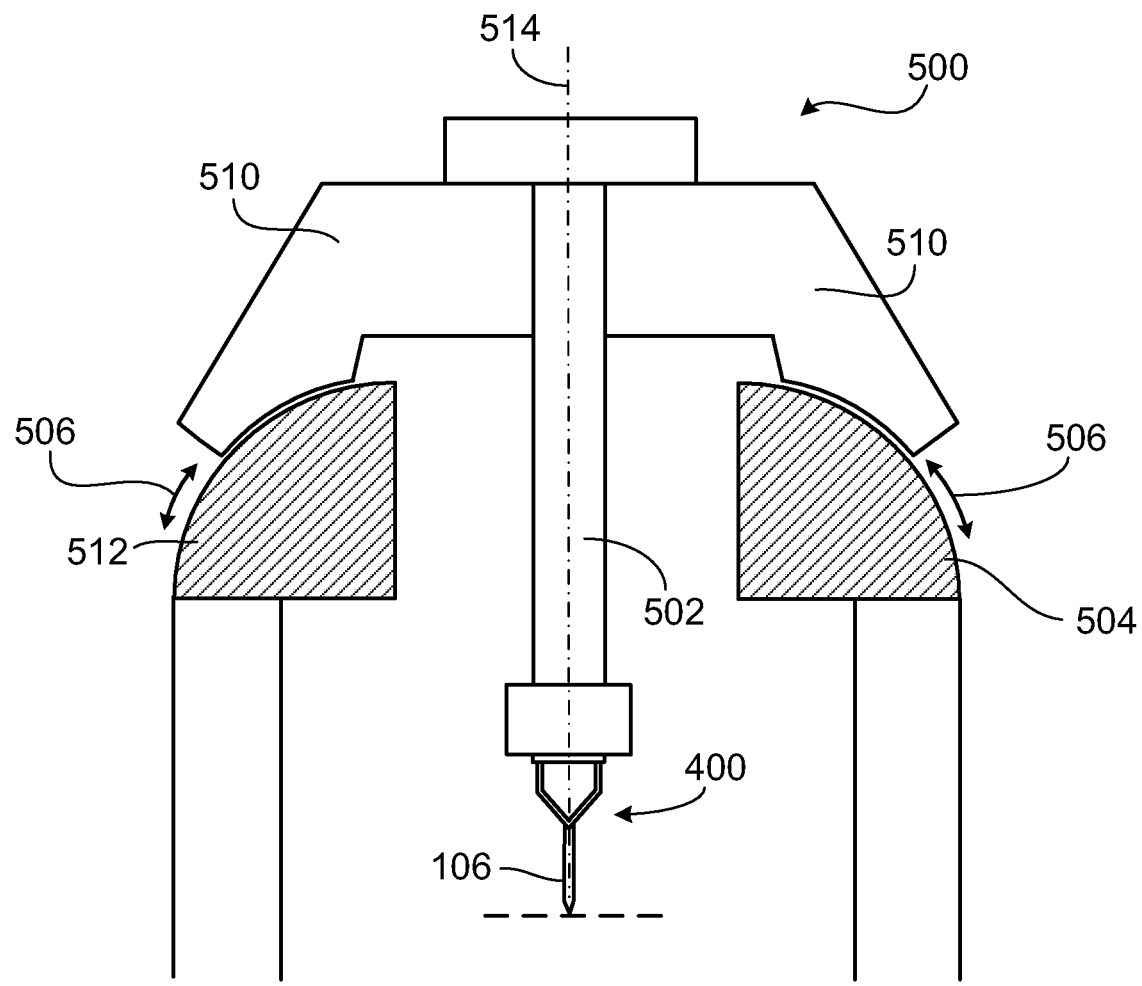
FIG. 5 depicts a tilting system to align the tip of the ion source according to one illustrative embodiment of the invention.

FIG. 5 depicts a tilting system 500 including an emitter 106 connected to an emitter assembly 400. In particular, the emitter assembly 400 is connected to a movable shaft 502 having a longitudinal axis 514 and shoulders 510. Shoulders 510 rest adjacent to a surface of a hemispherical dome 512 of the housing 504. Arrows 506 show the direction of movement of the shoulders 510 on dome 512 such that the tip of the emitter 106 is kept at a fairly constant position and the longitudinal axis 514 may be tilted at an angle away from the vertical. In one embodiment, the shoulders 510 and the hemispherical dome 512 are formed from materials having high mechanical strength and resistance to wear. In such an embodiment, suitable materials for the shoulders 510 and the hemispherical dome include phosphor, bronze and hardened steel.

In one example, the emitter 106 is aligned such that its <111> crystal axis is along the longitudinal axis 514. In such an embodiment, the most distal atomic shelf (e.g., atomic shelf 206 of FIG. 2 or atomic shelf 306a of FIG. 3) may instead have a single atom and the next lower atomic shelf may have three atoms. A voltage source similar to voltage source 112 may be used to apply a voltage to the emitter 106 such that an electric field is generated around the surface of the emitter 106. In certain embodiments, the single atom on the most distal shelf is released due to the applied electrostatic force. In such an embodiment, the tip 108 of the emitter 106 is left with three atoms ("trimer") as the most distal atomic shelf. The trimer may be used as an ion source capable of generating an ion beam along an axis nearly perpendicular to the plane defined by the trimer. In one embodiment, the emitter 106 may be tilted using tilting system 500 such that the longitudinal axis 514 of the emitter 106 is at an angle from the axis of the ion beam. In such an embodiment, one of the three atoms in the trimer lies on the axis of the ion beam. The emitter 106 may be tilted depending on the requirements of a particular application. For example, in microscopy applications requiring high resolution, it may be desirable to have small spot sizes for the ion beam. In such applications, it may be beneficial to tilt the emitter 106 as described above such that the ion beam is generated from one atom of the trimer. As another example, for some microscopy applications requiring high throughput of ions, it may be desirable to use all the three atoms of the trimer. The throughput of ions is typically known as the beam current which is measured as the rate at which the ions strike the surface of a detector.

Figure 6:
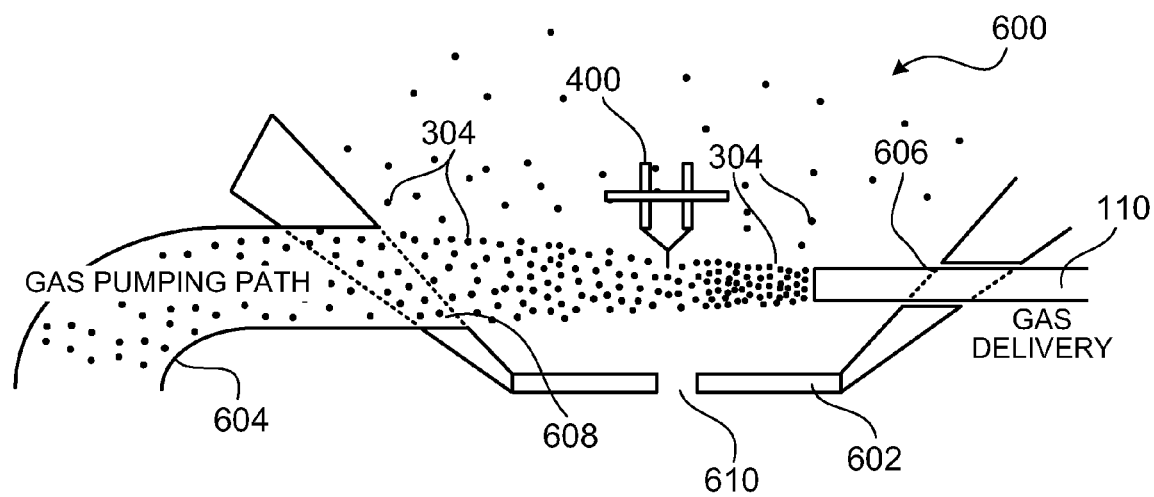
FIG. 6 depicts an ion source including a gas delivery and pumping system according to one illustrative embodiment of the invention.

FIG. 6 depicts an ion source 600 having gas delivery and pumping systems according to one illustrative embodiment of the invention. The ion source 600 includes an emitter assembly 400 disposed with housing 602. Housing 602 includes an aperture 606 for introducing gas atoms 304 near the emitter assembly 400. The gas atoms 304 are introduced through a gas source having a nozzle 110 such that the concentration of gas atoms near the emitter assembly 400 is higher. The housing 602 includes another aperture 608 for removing un-ionized gas atoms. The gas atoms 304 may be removed using a vacuum pump 116 connected through pumping path 604. The housing 602 further includes an aperture 610 to allow the gas ions to travel from the emitter assembly 400. In one embodiment, a portion of the aperture 610 may be connected to an electrical ground, thereby establishing a voltage difference between the tip 108 of the emitter assembly 400. In such an embodiment, the aperture 610 may serve as the extractor electrode similar to extractor electrode 122 of FIG. 1.

The housing 602 is made from similar materials to the housing 120 of FIG. 1. The aperture 606 is positioned near the emitter assembly 400 such that gas atoms 304 from the gas source may be aimed at the distal end 114 of the emitter. The aperture 606 may be suitably sized to allow gas delivery tubing to pass through from the gas source 110. In one embodiment, an aperture 608 is placed substantially collinear with the emitter assembly 400 and the aperture 606. In such an embodiment, the aperture 608 may allow for a connection between the housing 602 and the vacuum pump 116. Vacuum tubing may be connected along pumping path 604 to the aperture 608 such that a portion of the gas atoms may be removed from the system. Aperture 610 may be positioned along path of the ion beam generated at the emitter assembly 400. Apertures 606 and 608 may include airtight seals and suitable connectors and adapters to tightly connect the housing to the tubing. Aperture 610 may be sized to control beam current and the beam spot size.

As an example, helium atoms may be delivered to the emitter assembly 400 through aperture 606. During operation of the ion source 600, a fraction of the helium atoms may ionize and pass through aperture 610. In such an example, the remaining unreacted neutral helium atoms may be removed by a vacuum pump 116 from the housing 602 through aperture 608.

In other embodiments (not illustrated), the bottom of the housing 602, near aperture 610, includes an optional set of apertures. These optional apertures provide inlet locations for delivering gas atoms inside the housing 602. Gas sources 112 may be placed in connection with the apertures at the bottom to direct gas atoms at the distal end 114 of the emitter 106. The pressure of gas near the distal end 114 of the emitter 106 may be adjusted to yield a different ion beam intensity through aperture 610.

Figure 7:
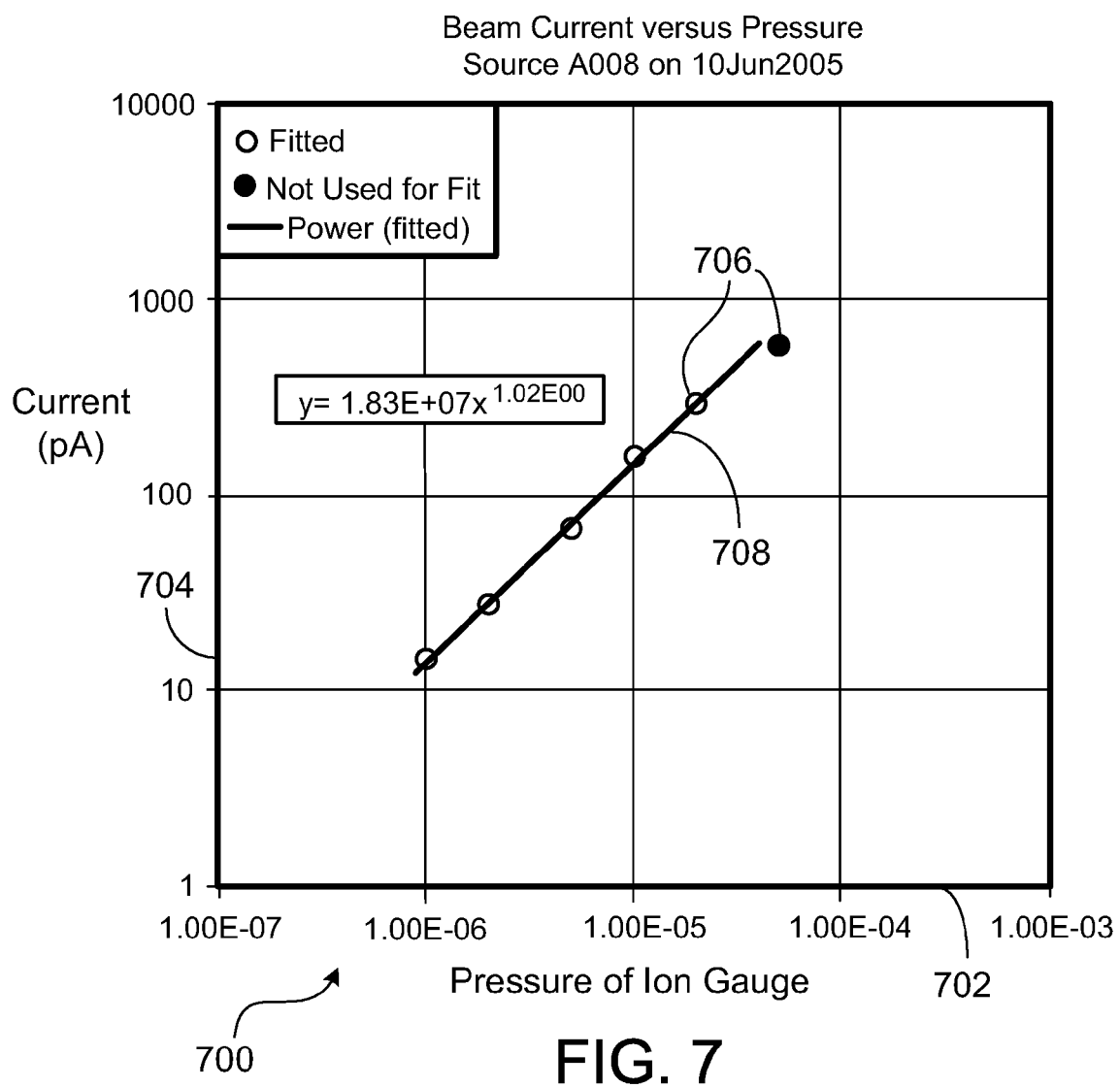
FIG. 7 is a chart showing the relationship between the ion beam current and gas pressure for an ion source according to one illustrative embodiment of the invention.

FIG. 7 depicts a chart 700 showing the relationship between the beam current and gas pressure in a log-log scale. The horizontal axis 702 shows the pressure of the ion gauge in Torr. The vertical axis 704 shows the beam current in pico-ampere. Test data points 706 are shown to be approximately represented by a line 708. In certain embodiments, the chart 700 may be used to adjust the pressure of the gas source 110 of FIGS. 1 and 6 to obtain particular values of beam current. The chart 700 shows that there is a power law relationship between the pressure of the gas delivered by the gas source and the current of the ion beam. Typically, as pressure is increased, the ion beam current is also increased. The ion source 600 of FIG. 6 may include a controllable gas source 112 to monitor and adjust the current of the ion beam by controlling the gas pressure.

During the operation of the gas field ion source 102, the gas source 112 is used to deliver an imaging gas the vicinity of the emitter 106. The gas source 112 may also be used to deliver a promoting gas to the emitter 106 to enhance the performance of the ion source and sharpen the tip 108 of the emitter 106.

Figure 8A:
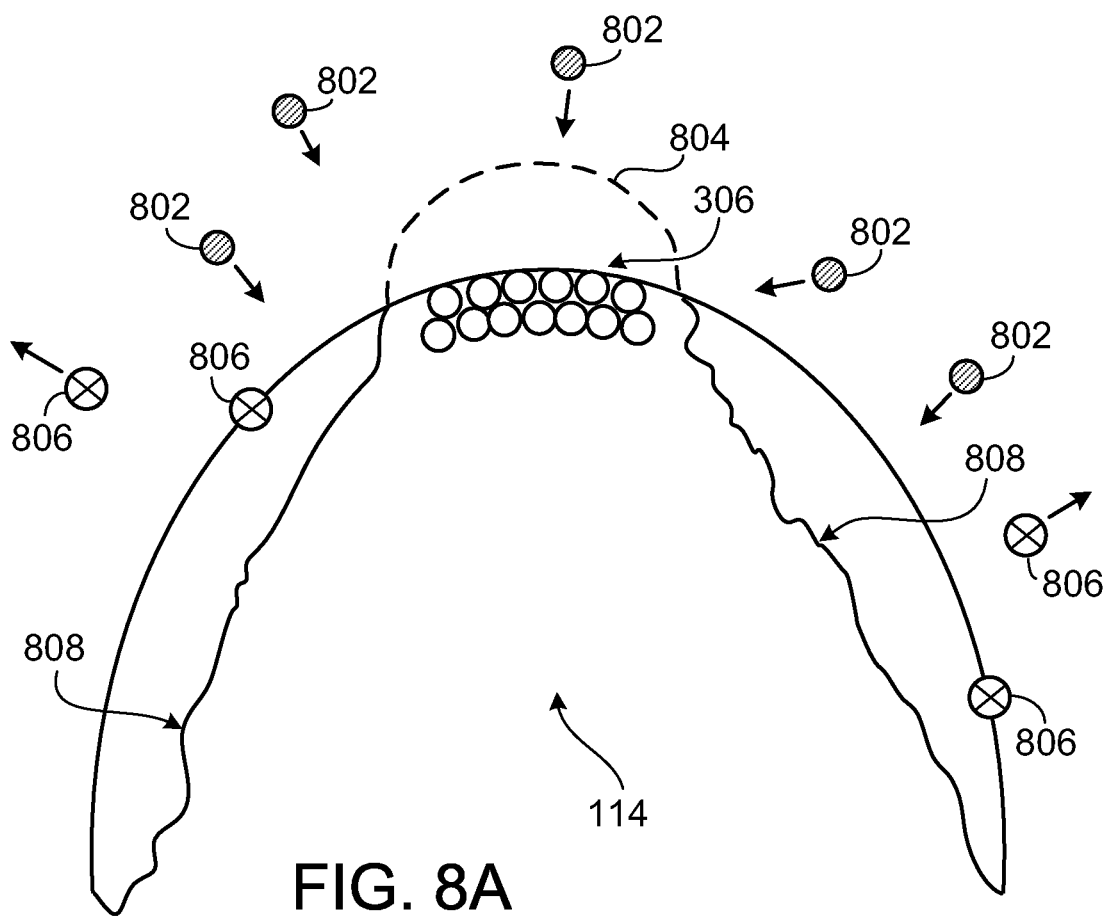
FIG. 8A depicts a method of chemically sharpening, in situ, the ion source according to one illustrative embodiment of the invention.

FIG. 8A depicts a method of sharpening the distal end 114 of an emitter 106 according to one illustrative embodiment of the invention. In particular, the distal end 114 of the emitter 106 is shown to have an atomic shelf 306. Reactive field-sensitive gas atoms 802 are delivered to a region near the distal end 114 of the emitter 106. In the presence of an electric field around the distal end 114, the field-sensitive gas atoms 802 ionize near an ionization barrier 804 and are typically accelerated away from the emitter 106. The ionization barrier 804 typically exists in a region near the top few atomic shelves 306. The field-sensitive gas atoms 802 near the distal end 114 and surrounding the top atomic shelves 306 chemically react with the emitter 106 to form a complex 806 and leave the surface of the emitter 106. The removal of emitter atoms can cause the surface of the emitter 106 to recede along boundary 808.

The distal end 114 of the emitter 106 is connected to a voltage source 112 as shown in FIG. 1. According to the method of the invention, the voltage source 112 may energize the emitter with a voltage of about 25 kV. The applied voltage causes an electric field to be set up in the region near the distal end 114. The electric field is typically inhomogeneous with areas of highest intensity near the atomic shelf 306. The field-sensitive gas atoms 802 are delivered to the emitter in the presence of the electric field. The gas 802 may be delivered using a gas source 110 shown in FIG. 1 at a pressure of about $10^{-6}$ Torr for about 30 minutes. Typically, during this time, the field-sensitive gas atoms 802 are influenced by the field and move towards the distal end 114 of the emitter 106. In one embodiment, the gas atoms 802 near the atomic shelf 306 get ionized at a certain distance away from the most distal atomic shelf 306. The ionized gas atoms 802 accelerate away from the emitter 106 in the presence of the field. In such an embodiment, reactive field-sensitive gas atoms 802 are discouraged from chemically reacting with emitter atoms on the atomic shelf 306. The location of ionization of the gas atoms 802 is typically known as the ionization barrier 804. The ionization barrier 804 can extend from about 3 nm to about 100 nm depending on at least the nature of the emitter 106, nature of the gas 802, operating voltages, gas pressure, temperature and time. For single crystal tungsten emitters energized to about 25 kV and treated with nitrogen gas for about 30 minutes at about $10^{-6}$ Torr, the ionization barrier can typically be about 30 nm. In certain embodiments, the voltage may be modified based at least in part on the nature of the image generated.

Surrounding the ionization barrier 804, the field-sensitive gas atoms 802 typically reach the surface of the emitter 106. In the presence of an electric field, gas atoms 802 react with the atoms on the surface of the emitter 106 and form complexes 806. These complexes 806 typically tend to leave the surface of the emitter thereby removing atoms from the emitter 106. As the reaction between the gas atoms 802 and the emitter 106 continues, the surface of the emitter 106 begins to recede, as shown by the boundary 808. The rate of removal of atoms from the emitter 106 depends on, among other things, the proximity to the atomic shelf 306 and the ionization barrier 804. The removal of emitter atoms from the surface and the receding boundary 808 helps to sharpen the distal end 114 of the emitter 106 in situ. Typically about 50 nm to about 500 nm of the length of the distal end may have a receded boundary 808.

Figure 8B:
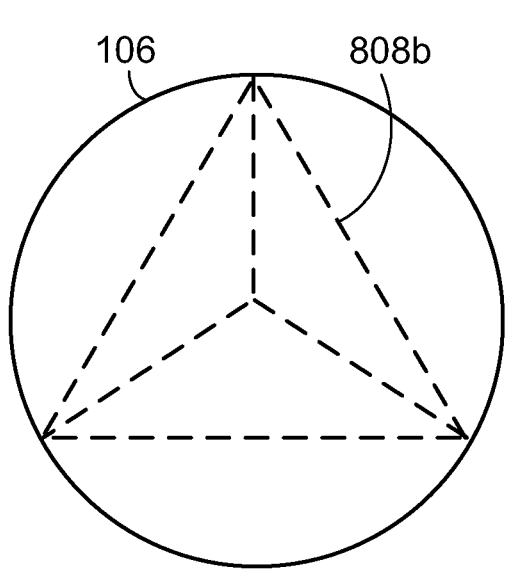
FIGS. 8B and 8C show a top view of the ion source in FIG. 8A after being partially sharpened according to one illustrative embodiment of the invention.
Figure 8C:
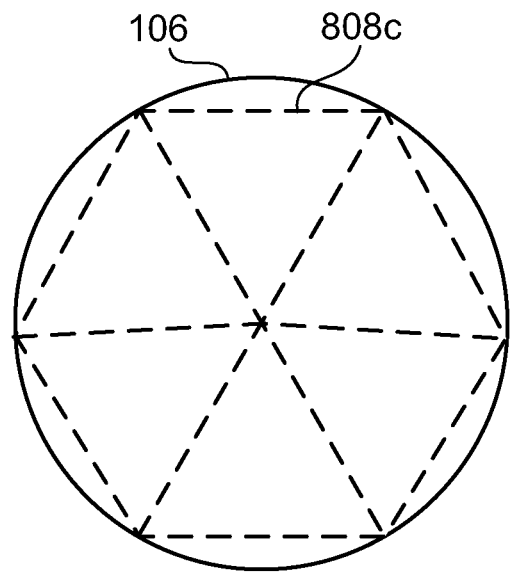

In certain embodiments, some reactive field-sensitive gas atoms 802 react with the emitter 106 preferentially along some crystallographic planes. FIGS. 8B and 8C show a top view of the emitter 106 in FIG. 8A after being subjected to a voltage and field-sensitive gas atoms 802. In particular, FIG. 8B shows a receded boundary 808b describing a triangular shape. FIG. 8C shows a receded boundary 808c describing a hexagonal shape. In FIGS. 8A and 8B, the boundaries 808b and 808c are preferentially along particular crystal planes thereby giving them a triangular and hexagonal shape, respectively.

Figure 9A:
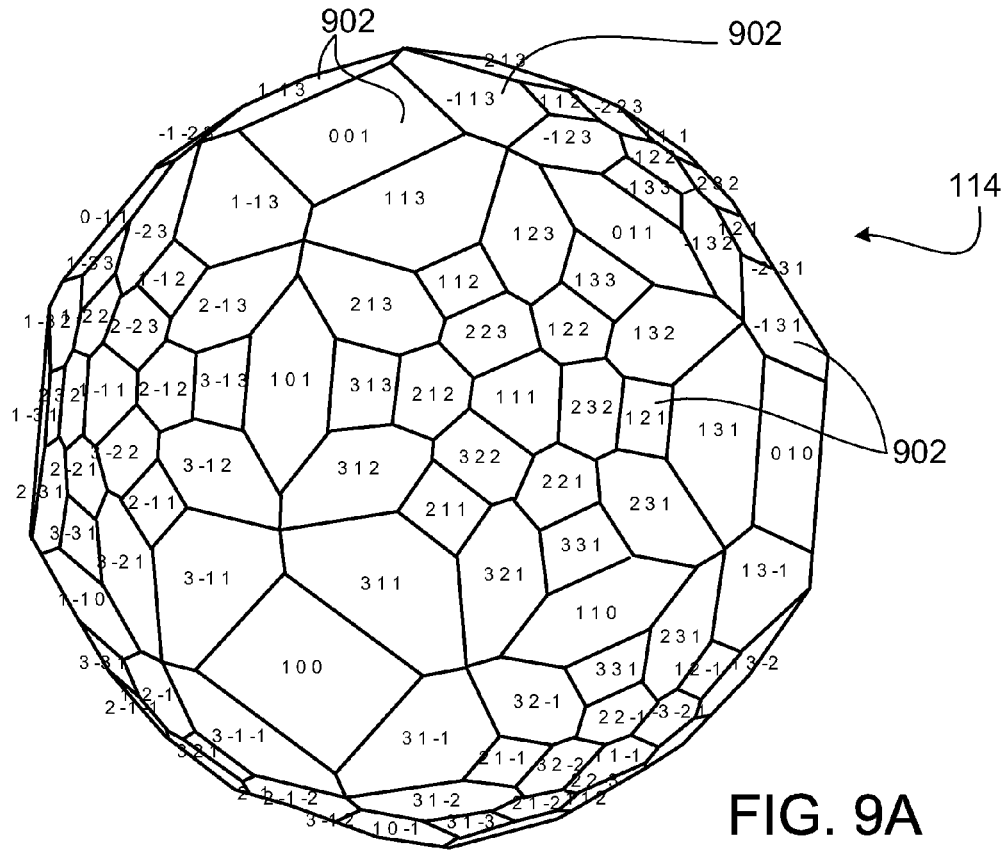
FIG. 9A depicts a top view of a fairly blunt crystalline ion source according to one illustrative embodiment of the invention.

Resharpening of a blunt emitter tip 108 may also be performed by rearranging the atoms on the surface of the emitter to conform to different crystallographic configurations. FIG. 9A depicts a top view of the distal end 114 of a fairly blunt emitter 106. The distal end 114 comprises an equilibrium crystallographic structure having facets 902. In one embodiment, the facets 902 have approximately the same energy and the equilibrium shape is roughly spherical.

According to one embodiment, the surface of the emitter 106 is typically heated to a temperature of about 1500 K until it is glowing yellow-orange (e.g., the emitter 106 can be heated by applying a current to the heater wires 404 of FIGS. 4A and 4B). During this time, many atoms and molecules adsorbed on the surface of the emitter 106 are removed including hydrocarbon molecules and oxygen atoms. The emitter 106 can be heated to a temperature of about 1100 K and promoting gas atoms can be delivered to the emitter 106 by the gas source 110 of FIG. 1. During this time, the atoms on the surface of the emitter 106 rearrange according to a preferential crystallographic structure. The heating time depends on, among other things, the initial shape of the emitter tip 108 and the desired final radius. In one embodiment, the time and pressure are chosen such that about one monolayer of promoting gas atoms are adsorbed on the surface of the emitter 106. At a gas pressure of about $10^{-6}$ Torr, this takes about a second. The choice of temperature may also be adjusted depending on the desired shape of the emitter 106. Typically, a low temperature results in a slow reaction time with some sharpening, and a high temperature result in an increase in tip 108 radius. Promoting gas atoms, such as hydrogen, oxygen, platinum and palladium absorbed on the surface generally increase mobility of the atoms on the surface of the emitter 106 and thereby help them rearrange themselves to a suitable structure. In certain embodiments, a voltage source 112 may also energize the emitter 106.

In an alternative embodiment, a monolayer of atoms may be applied to promote the crystal faceting process by heating the promoting atoms in a location away from the emitter 106 until they are vaporized and travel as gas atoms. In such an embodiment, the promoting atoms include solid metals such as palladium and platinum.

Figures 9B, 9C:
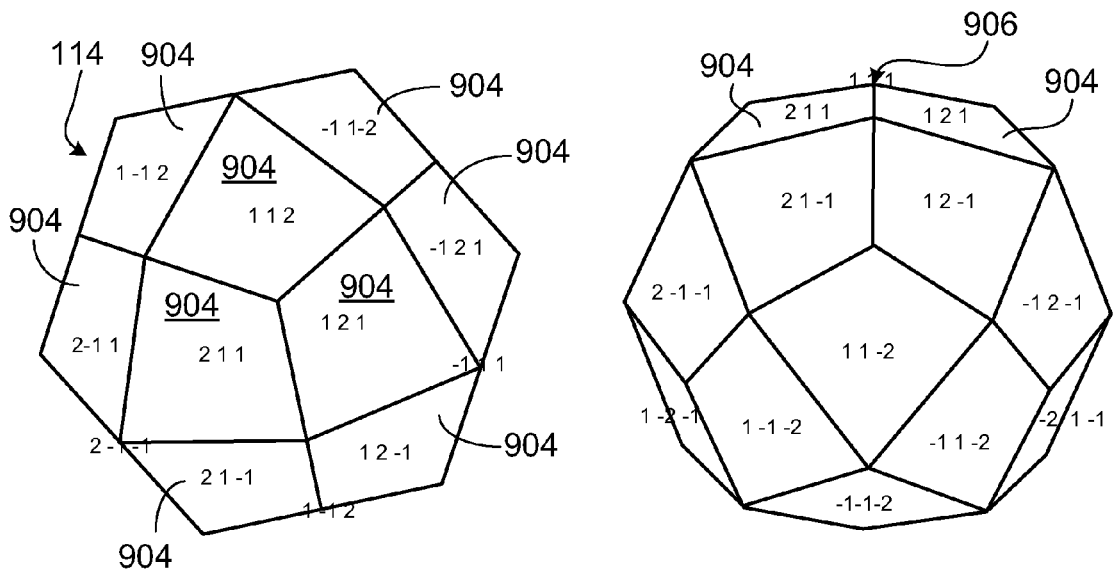
FIG. 9B depicts a top view of the ion source after being partially sharpened, in situ, according to one illustrative embodiment of the invention.
FIG. 9C depicts a three-dimensional view of the tip of the ion source of FIG. 9B.

FIG. 9B depicts a top view of the distal end 114 of an emitter 106 after in situ sharpening using the method described above. The distal end 114 comprises a crystallographic structure having facets 904. The <111> crystallographic structure is shown to be directed out of the page. The facets 904 have the lowest surface energy and are therefore preferred by the surface atoms.

FIG. 9C depicts a three-dimensional view of the distal end 114 of an emitter 106 of FIG. 9B. In particular, FIG. 9C shows a front three-dimensional view of the tip 108 of an emitter 106. The emitter 106 tapers to an atom located on the <111> axis at location 906.

Figure 10:
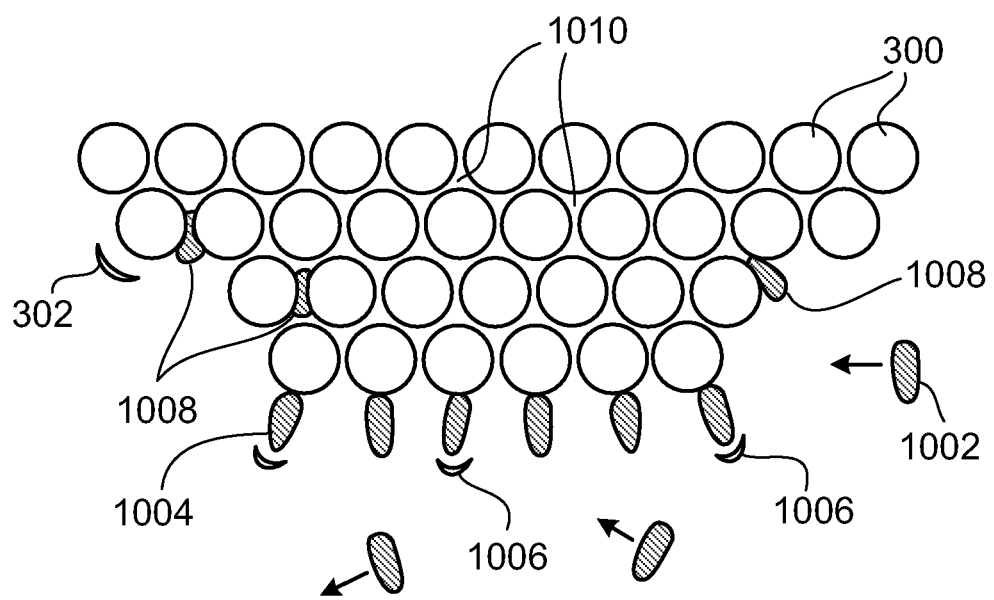
FIG. 10 depicts a zoomed-in view of the tip of an ion source treated with a reactive gas according to one illustrative embodiment of the invention.

In certain embodiments the promoting gas atoms may be added to the surface of the emitter 106 to enhance the intensity of the electric field in the vicinity the distal end 114 of the emitter. FIG. 10 depicts a zoomed-in view of the distal end 114 of the emitter 106 treated with reactive gas atoms according to one illustrative embodiment of the invention. In particular, the distal end 114 includes atoms 300 arranged in a crystallographic structure having atomic shelves (e.g., only 4 atomic shelves are shown in FIG. 10 for purposes of clarity). In the presence of an applied voltage, an ionization disc 302 is formed in a region near the surface of the emitter 106 away from the atoms 300.

A gas source 110 may deliver adsorbing gas atoms 1002 to the surface of the emitter 106. In certain embodiments, the pressure of adsorbing gas 1002 near the emitter 106 may be chosen to be about 10% of the pressure of the imaging gas. In such an embodiment, the pressure of the imaging gas may be about $5 \times 10^{-6}$ Torr and the pressure of the adsorbing gas 1002 may be about $5 \times 10^{-7}$ Torr. The gas atoms 1002 attach to a position on an atom 300 located on the surface of the emitter 106. In one illustrated embodiment, the gas atoms 1002 are elongated and the elongated attached gas atoms 1004 are positioned vertically on the emitter atoms 300. In the presence of an applied voltage, an ionization disc 1006 is formed in a region near the attached gas atoms 1004. In certain embodiments, the ionization disc 1006 is typically located further away from the surface of the emitter than the ionization disc 302. During the ionization of an imaging gas, electrons may prefer to tunnel into the attached gas atom 1004 rather than the emitter atom 300. As a result, the ionization process may be promoted (e.g., the ionization work function may be decreased) and the operating voltage to the emitter may be lowered. Alternatively, the rate of ionization may be increased for a given operating voltage.

Furthermore, crevices 1010 between emitter atoms 300 may be formed due to imperfect packing of the spherically shaped atoms in each atomic shelf and between atomic shelves. In certain embodiments, the gas atoms 1008 may also occupy such crevices 1010. The gas atoms 1008 help to reduce the work function of the emitter 106 and therefore promote ionization.

Figure 11A:
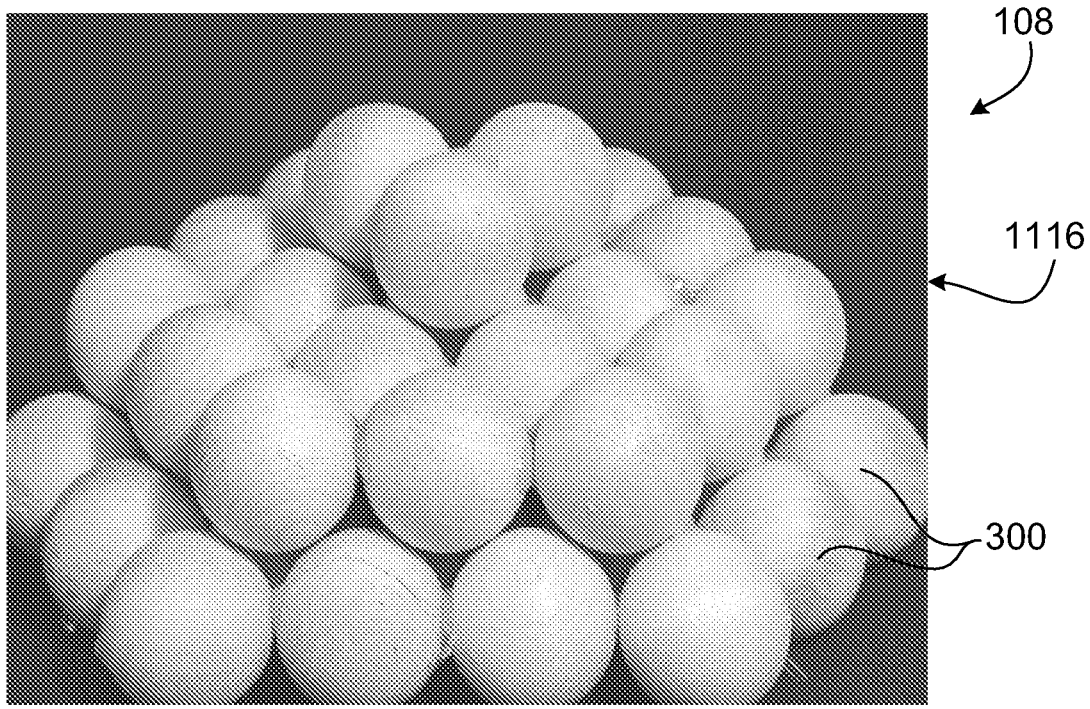
FIGS. 11A and 11B depict a three-dimensional view of an arrangement of atoms on the tip of an ion source.
Figure 11B:
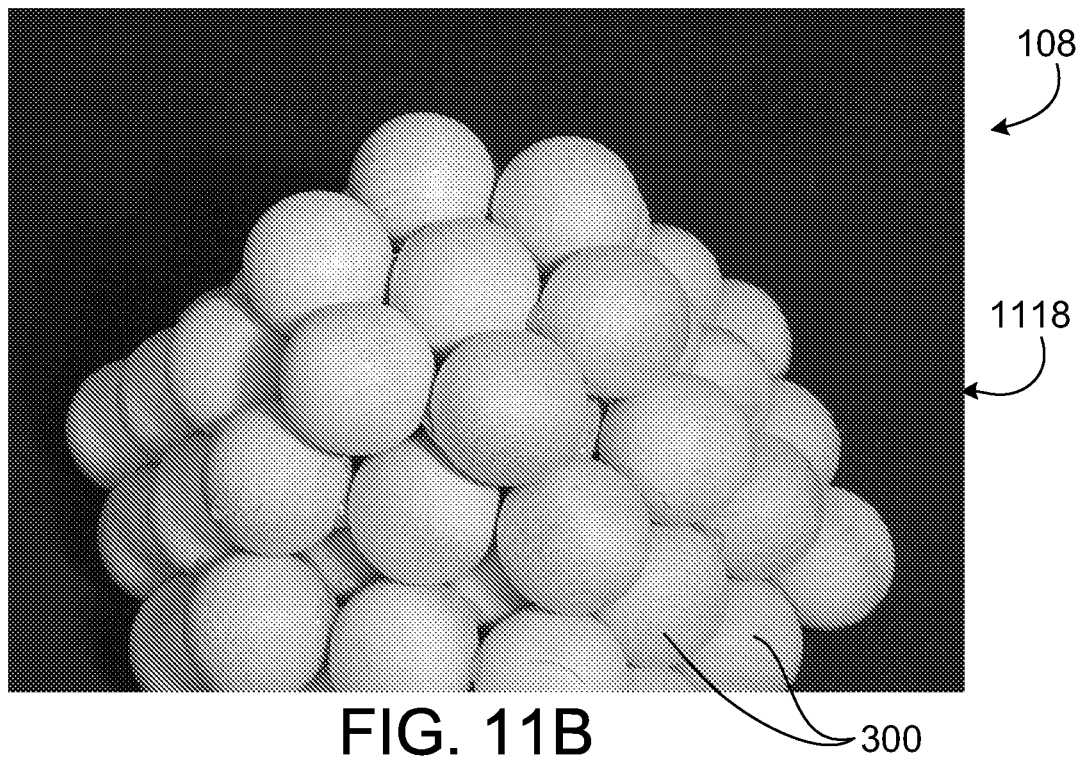

FIGS. 11A and 11B depict a three-dimensional view of an arrangement of atoms on the tip 108 of an emitter 106 shown in FIG. 1. In particular, FIG. 11A shows the emitter atoms 300 arranged such that there are three atoms ("trimer") on the top shelf 1116. FIG. 11B shows an emitter having atoms 300 arranged such that there are seven atoms arranged on the top shelf 1118. In one application, the emitter 106 with tip 108 shown in FIGS. 11A and 11B may be used as an ion source for a an ion microscope. In such an application, the intensity of a generated ion beam and the size of the beam spot may be adjusted by changing the number of atoms 300 at the tip 108 of the emitter 106. The number of atoms 300 at the tip of the emitter help determine the size of the ionization region above the tip 108. A greater number of atoms typically increase the size of the ionization region and consequently increases the intensity of the ion beam. Fewer atoms at the tip help maintain small beam spot sizes. The tip 108 shown in FIG. 11A may be used for applications requiring small beam spot sizes while the tip 108 shown in FIG. 11B may be used for applications allowing for larger beam spot sizes while requiring higher beam intensity.

Figure 12C:
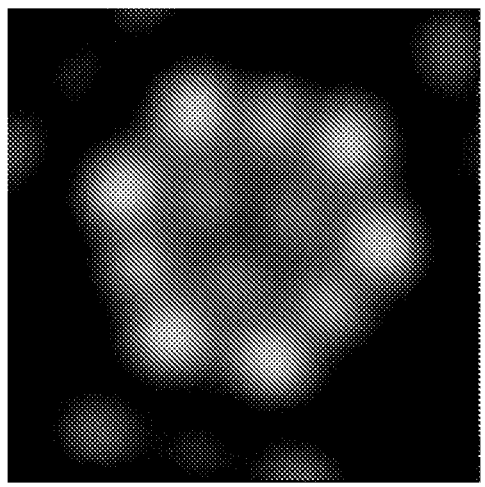
FIGS. 12A-12F are field ion microscope (FIM) images of various tips according to one illustrative embodiment of the invention.
Figure 12F:
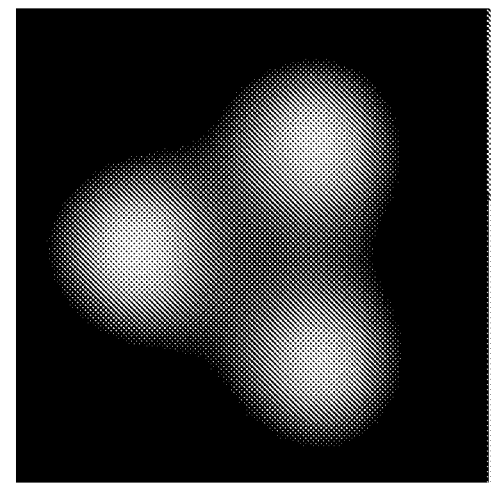
Figure 12B:
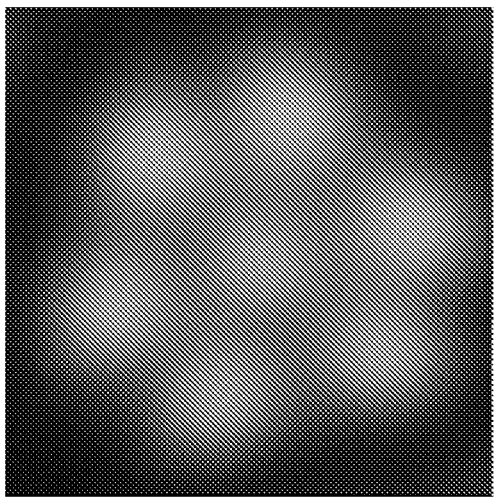
Figure 12E:
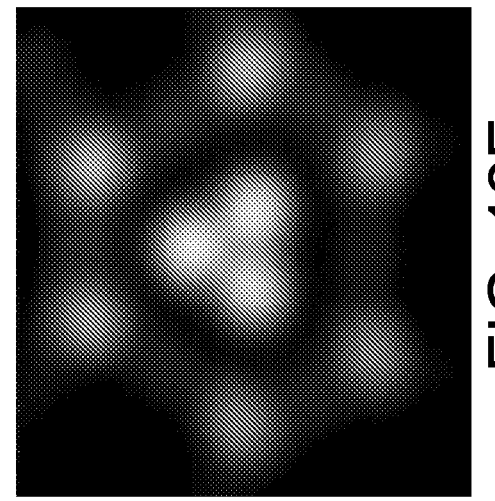
Figure 12A:
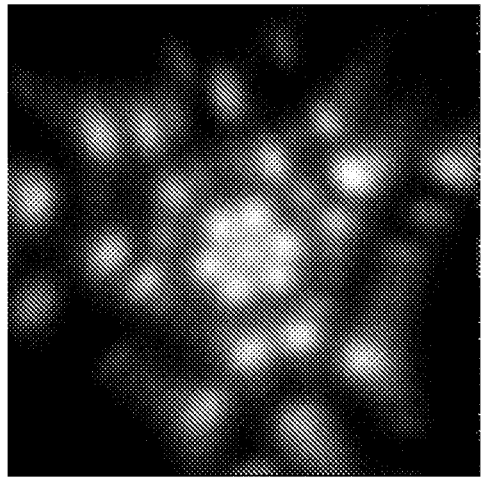
Figure 12D:
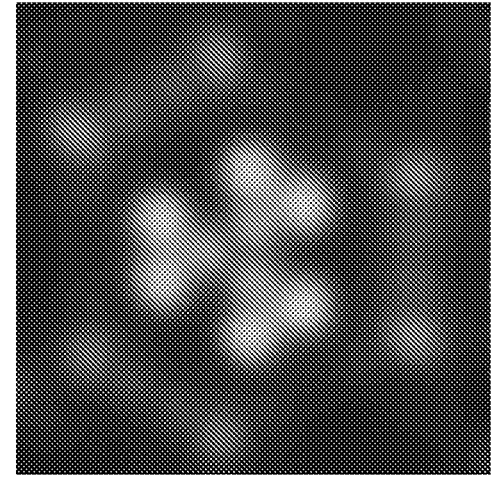

FIGS. 12A-12F (generally "FIG. 12") depict field ion microscope (FIM) images of different tips 108 of the emitter 106 of FIG. 1. Bright regions in FIG. 12 indicates location of atoms and the level of brightness typically indicates the position of the atomic shelf when viewed from above. FIGS. 12A and 12B are images of a tip 108 having seven atoms on the top shelf similar to FIG. 11B. FIGS. 12C and 12D are images of a tip 108 having twelve atoms on the top shelf. FIGS. 12E and 12F are images of a tip 108 having three atoms on the top shelf similar to FIG. 11A.

Figure 13:
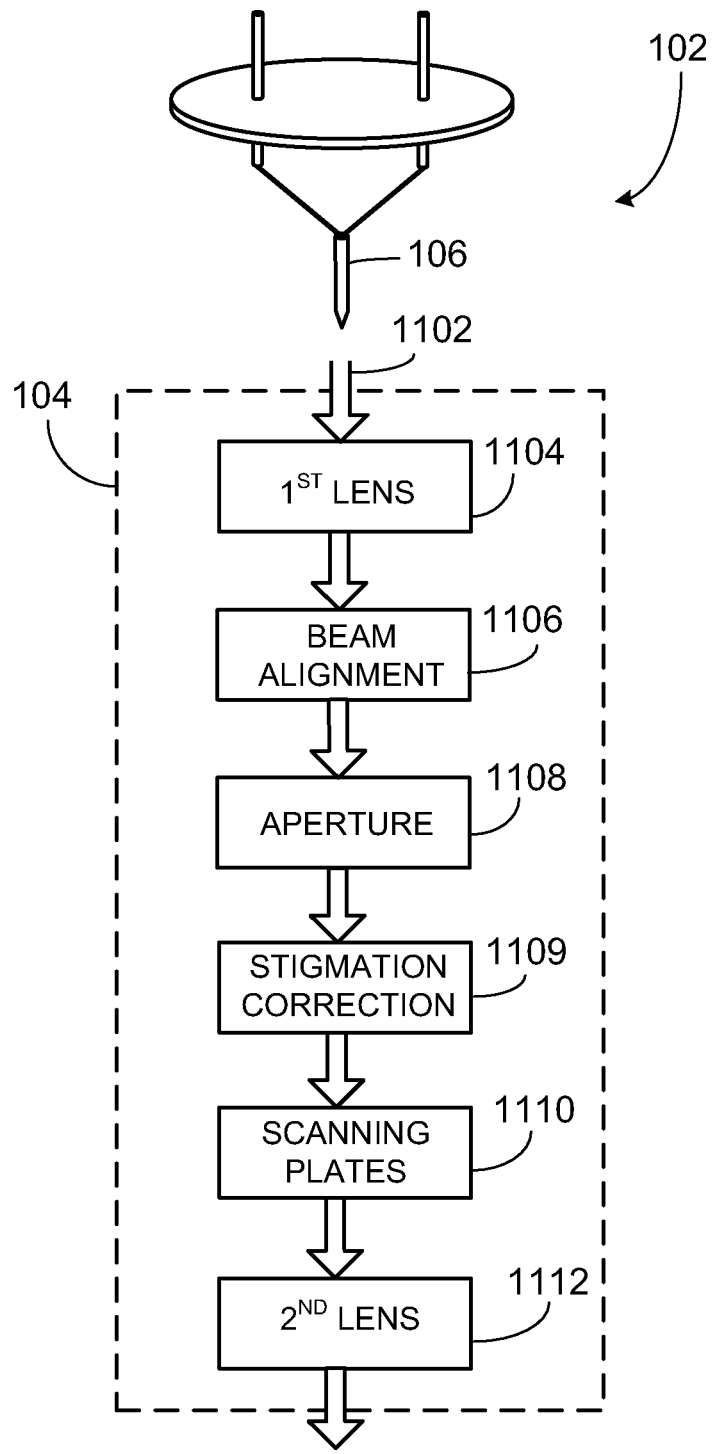
FIG. 13 depicts a high-level block diagram of an optical column for an ion source assembly according to one illustrative embodiment of the invention.

FIG. 13 depicts a high-level block diagram of an optical column 104 for an ion source 100 according to one illustrative embodiment of the invention. The optical column includes a first set of focusing lenses 1104, one or more stages of beam alignment optics 1106, an aperture 1108, stigmation correction optics 1109, one or more stages of scanning plates 1110 and a second set of focusing lenses 1112. An ion beam 1102 may travel from the emitter 106 of an ion source 102 along the optical column 104 and through optical elements 1104, 1106, 1108, 1110 and 1112.

The first set of focusing lenses 1104 includes at least one electrostatic lens. The electrostatic lens may be capable of accelerating, decelerating, collimating, focusing or deflecting an ion beam 1102 generated by an ion source 102 for further processing within the optical column 104. The first focusing lens 1104 may include other lenses without departing from the scope of the invention. FIGS. 14-17 depict some examples of a first set of lenses 1104 being used within an optical column 104.

The beam alignment optics 1106 generally include a set of about 8 electrodes which can direct the ion beam along a specified path along the optical column. The electrodes are typically arranged as a pair of sequential quadrupoles. Alternative plate arrangements such as octupoles may also function similarly. In one embodiment, each quadrupole can deflect the beam in a plurality of combinations of horizontal and vertical directions. The two quadrupoles allow the beam path to be directed so that it can pass through the center of the aperture and the center of the second set of lenses. The controlled beam path can compensate for other factors which may cause the beam to not pass thought the center of the column. Such factors include undesired fields, or mechanical misalignments.

The beam alignment optics can also include beam stops so that the beam can be interrupted before it passes through the remainder of the optical column.

Figure 18:
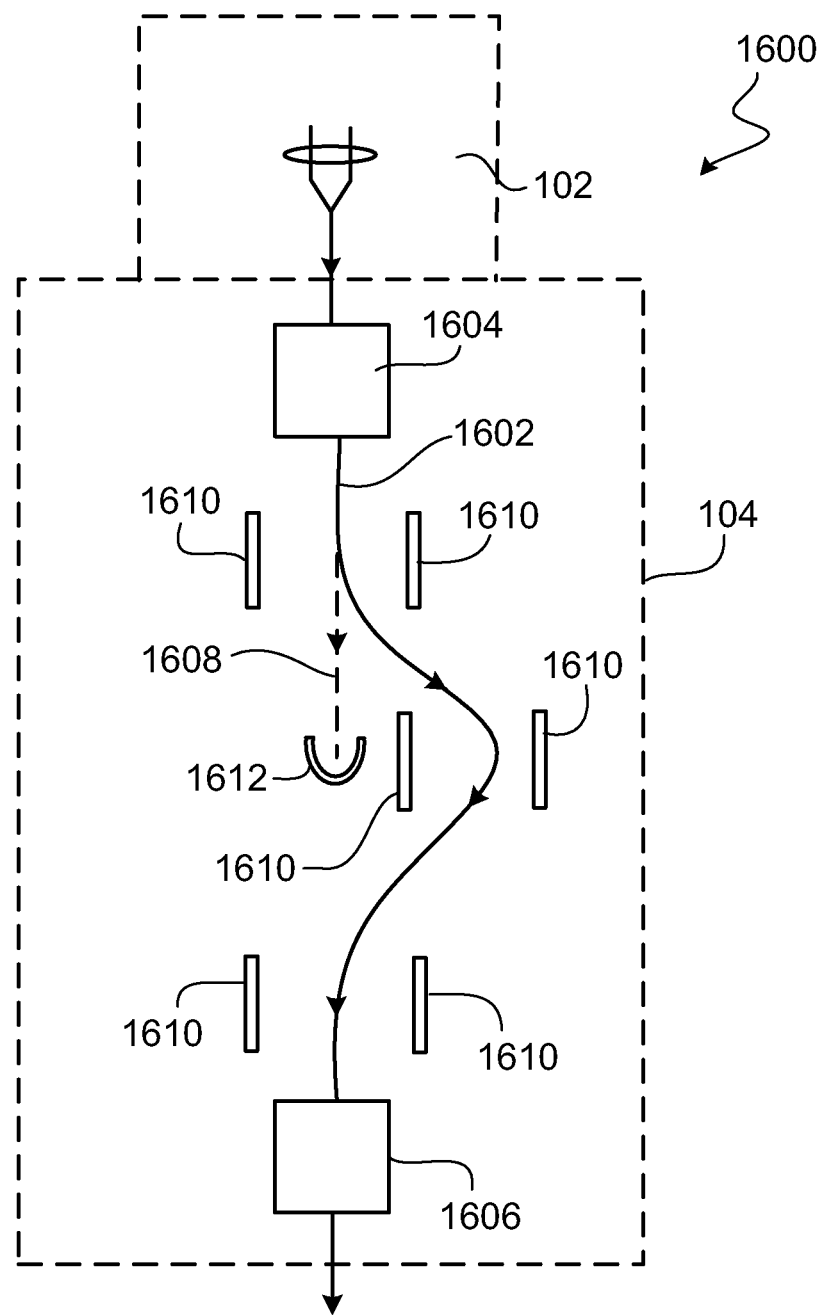
FIG. 18 depicts an ion source assembly having an ion source and an optical column configured to enhance the constitution of the ion beam according to one illustrative embodiment of the invention.

In one embodiment, the beam alignment optics can also include devices which limit the passage of certain constituents of the beam. For example, high energy neutrals can be limited by a set of at least 3 deflector pairs as shown in FIG. 18. The neutral beam is typically undeflected and is collected in a beam stop 1612. The desired beam is deflected off axis and back on axis to its original path. Such an embodiment can be used to remove doubly charged ions, or ions having other masses.

An aperture 1108 may be used in an optical column, among other things, to control the size of the beam spot. In one application the ion source 102 and the ion column 104 are parts of an ion microscope. In such an application, the resolution of the ion microscope may be controlled by the size of the beam spot. Typically, a smaller beam spot gives a higher resolution. The aperture 1108 typically includes a sheet of opaque material with one or more holes. In certain embodiments, the diameter of the hole can be from about 5 μm to about 200 μm. FIGS. 14-17 show different apertures 1108 depending on the requirements of a particular application.

The stigmation correction optics 1109 includes elements to correct for astigmatism of the ion beam. In one embodiment, the stigmation correction 1109 includes a set of about 8 or more electrodes which are typically azimuthally distributed. In such an embodiment, the voltages on the electrodes may be distributed as V1, V2, −V1, −V2, V1, V2, −V1, −V2. Suitable values of V1 and V2 may be used to correct astigmatism of the ion beam. In another embodiment, a negative astigmatism may be introduced which can then be nulled by an astigmatism introduced by subsequent column elements. In alternative embodiments, other voltages may be superimposed upon the electrodes in such a way that the astigmatism is achieved while also achieving other purposes such as focus, or beam deflection.

The optical column also comprise electrostatic plates 1110 which are capable deflecting the beam in a direction substantially perpendicular the column axis. Generally the deflection is accomplished in about two stages. The first stage typically deflects the beam off the axis of the optical column 104, and the second stage deflects the beam back towards the axis such that it passes through the axis at a pivot point, and strikes the sample off axis. The voltage applied to the electrostatic plates 1110 controlling the deflection can be ramped so that the beam landing position may be a raster pattern. Rastering may also be performed with a single stage of deflection. Rastering is typically done in about two orthogonal directions (named X and Y) so that a rectangular region of the sample may be exposed to the beam. Each stage of deflection can be realized with quadrupoles or octupoles so that a proper selection of voltages can produce beam deflection in any combination of the X and Y directions.

The second set of focusing lenses 1112 includes at least one electrostatic lens. The electrostatic lens may be capable of accelerating, decelerating and focusing an ion beam onto a sample located near the optical column 104. The second focusing lens 1104 may include other lenses without departing from the scope of the invention.

Figure 14:
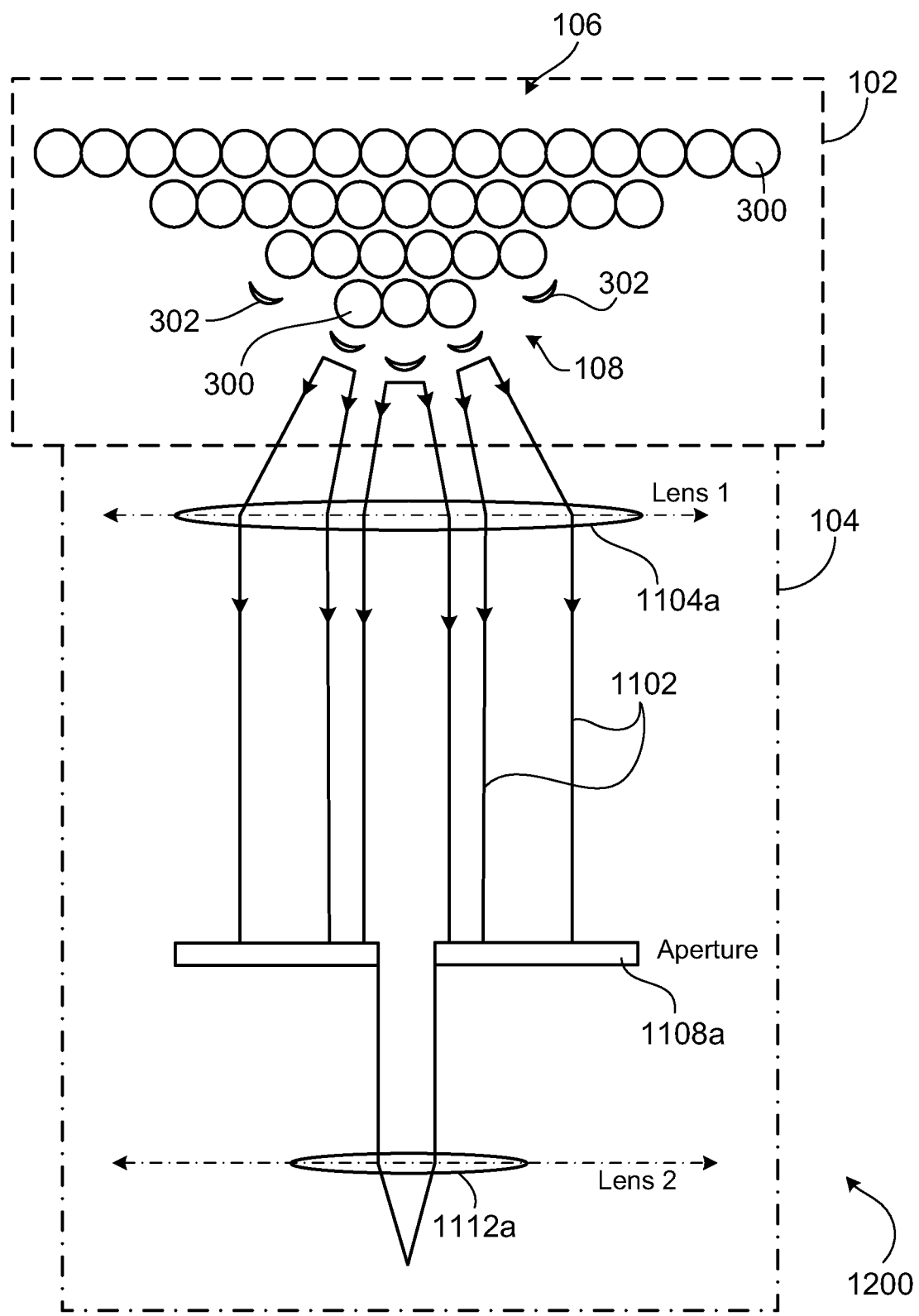
FIG. 14 shows an ion source assembly having an ion source and an optical column according to one illustrative embodiment of the invention.

FIGS. 14-17 depict a gas field ion source in connection with an ion column for generating and focusing an ion beam according to one illustrative embodiment of the invention. In particular, FIG. 14 shows an assembly 1200 having an ion source 102 and an optical column 104. The ion source 102 includes an emitter 104 having a tip 108 comprising three atoms 300. On an application of voltage to the emitter 104, an inhomogeneous electric field is generated such that ionization discs 302 are formed around atoms 300 near the tip 108. During the operation of the ion source, an ion beam 1102 is generated from the ionization discs 302 and accelerated away from the emitter 106 and into the optical column 104.

The optical column 104 includes a first lens 1104a, an aperture 1108a and a second lens 1112a. The first lens 1104a reduces the divergence of the incoming ion beam 1102 and directs the low divergence ion beam 1102 towards the aperture. The aperture 1108a allows a fraction of the ions in the ion beam to pass through to the second lens 1112a. The second lens 1112a focuses the ion beam on to a point on the sample.

The assembly 1200, allows for ions generated from substantially all three atoms on the tip 108 of the emitter 106 to be directed along the optical column 104. The aperture 1108a reduces the beam intensity by blocking a fraction of the beam and reduce the beam spot size. The assembly 1200 allows for a portion of the ion beam from one or more atoms to be focused on a sample.

Figure 15:
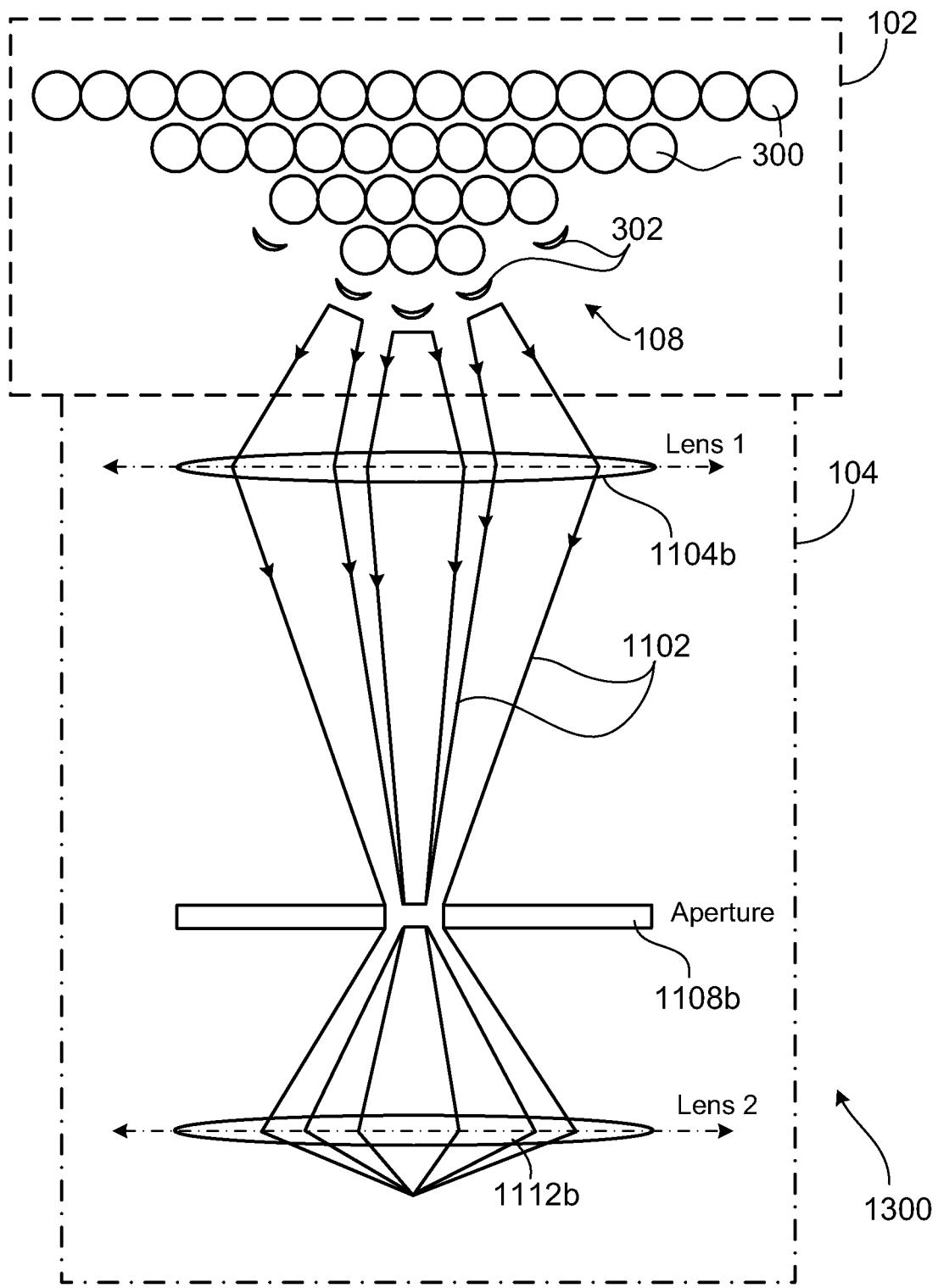
FIG. 15 shows an ion source assembly having an ion source and an optical column according to another illustrative embodiment of the invention.

FIG. 15 shows an assembly 1300 having an ion source 102 and an optical column 104. The ion source 102 includes an emitter 104 having a tip 108 comprising three atoms 300. On an application of voltage to the emitter 104, an inhomogeneous electric field is generated such that ionization discs 302 are formed around atoms 300 near the tip 108. During the operation of the ion source, an ion beam 1102 is generated from the ionization discs 302 and accelerated away from the emitter 106 and into the optical column 104.

The optical column 104 includes a first lens 1104b, an aperture 1108b and a second lens 1112b. The first lens 1104b partially focuses the incoming ion beam 1102 and to a location near the center of the aperture 1108b. The aperture 1108b allows the partially focused ion beam to diverge and pass through to the second lens 1112b. The second lens 1112b re-focuses the ion beam on to a point on the sample. The assembly 1300, allows for ions generated from substantially all three atoms on the tip 108 of the emitter 106 to be focused on the sample.

Figure 16:
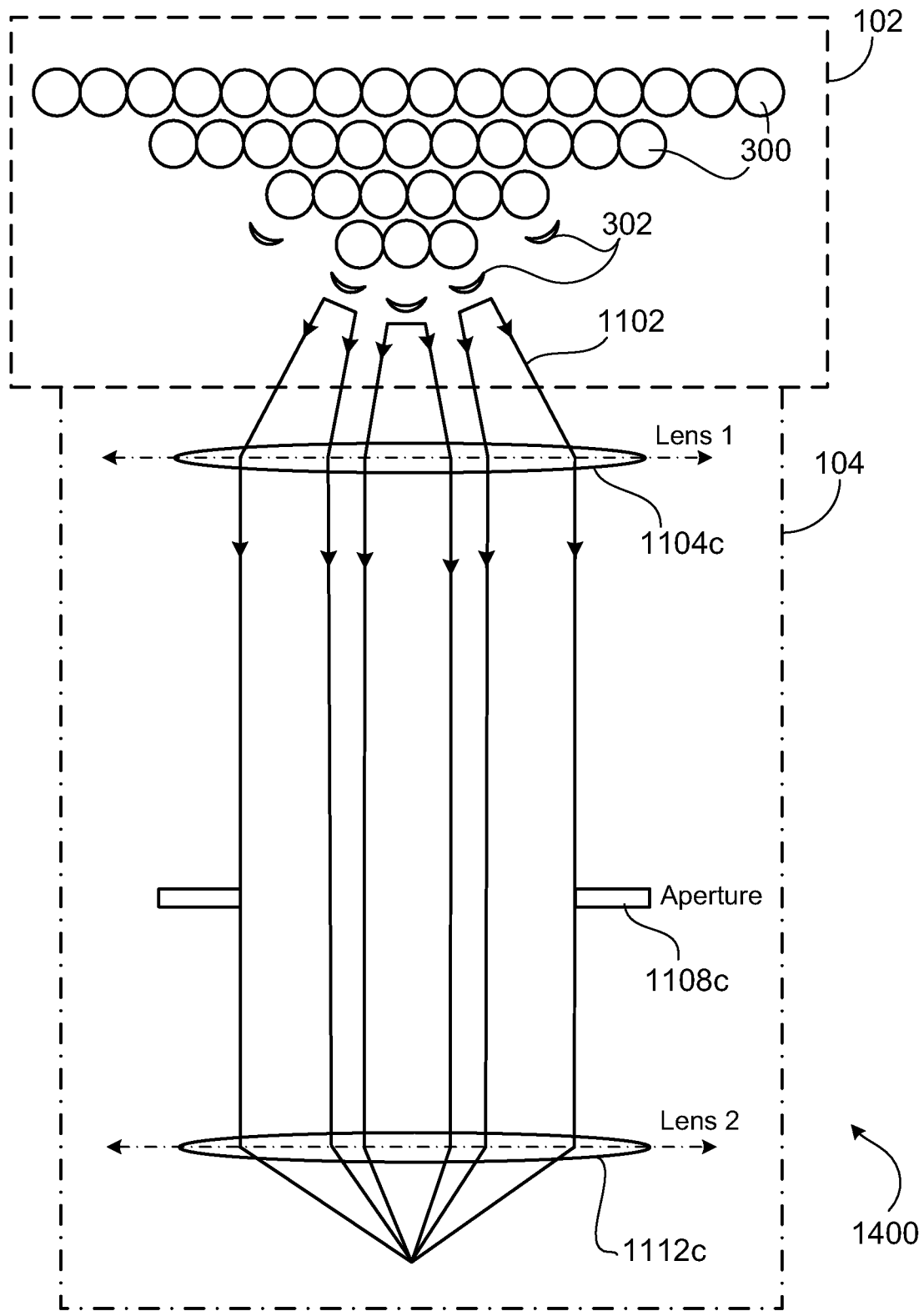
FIG. 16 shows an ion source assembly having an ion source and an optical column according to another illustrative embodiment of the invention.

FIG. 16 shows an assembly 1400 having an ion source 102 and an optical column 104. The ion source 102 includes an emitter 104 having a tip 108 comprising three atoms 300. On an application of voltage to the emitter 104, an inhomogeneous electric field is generated such that ionization discs 302 are formed around atoms 300 near the tip 108. During the operation of the ion source, an ion beam 1102 is generated from the ionization discs 302 and accelerated away from the emitter 106 and into the optical column 104.

The optical column 104 includes a first lens 1104c, an aperture 1108c and a second lens 1112c. The first lens 1104c reduces the divergence of the incoming ion beam 1102 and directs the low divergence ion beam 1102 towards the aperture. The aperture 1108c allows substantially all of the ions in the ion beam to pass through to the second lens 1112c. The second lens 1112c focuses the ion beam on to a point on the sample.

The assembly 1400, allows for ions generated from substantially all three atoms on the tip 108 of the emitter 106 to be directed along the optical column 104. The aperture 1108c maintains the beam intensity by allowing substantially all ions of the beam. The assembly 1400 further allows for a substantial portion of the ion beam from three or more atoms to be focused on a sample. The assembly 1400 generates ion beams 1102 having larger beam spots as compared to assembly 1200.

Figure 17:
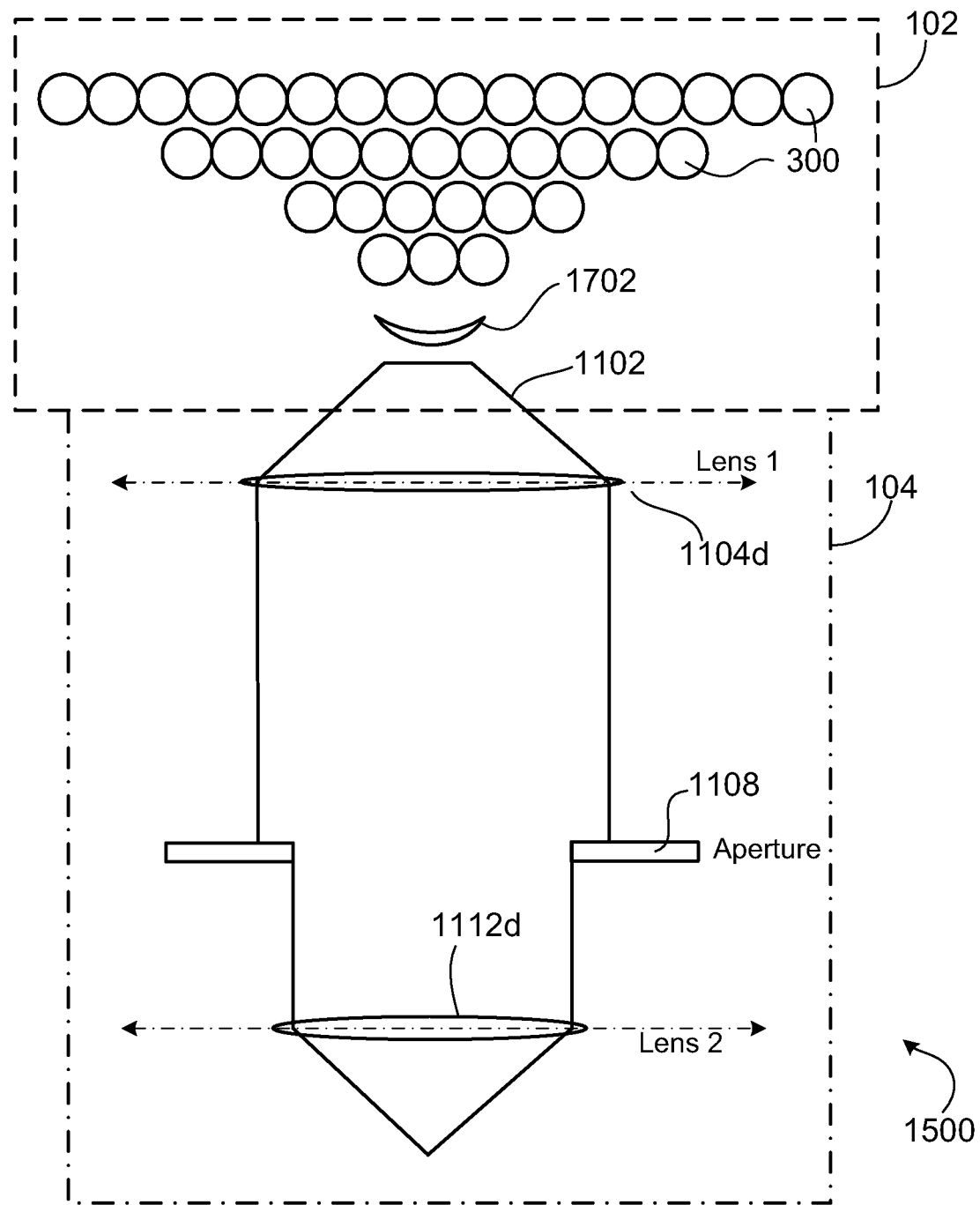
FIG. 17 shows an ion source assembly having an ion source and an optical column according to still another illustrative embodiment of the invention.

FIG. 17 shows an assembly 1500 having an ion source 102 and an optical column 104. The ion source 102 includes an emitter 106 having a tip 108 comprising three atoms 300. On an application of voltage to the emitter 104, an inhomogeneous electric field is generated such that an ionization disc 1702 is formed around atoms 300 near the tip 108. The applied voltage in assembly 1500 is typically larger than the applied voltage in assemblies 1200, 1300 and 1400. The higher applied voltage typically causes the ionization discs from individual atoms to overlap forming a larger ionization disc 1702. During the operation of the ion source, an ion beam 1102 is generated from the ionization discs 302 and accelerated away from the emitter 106 and into the optical column 104.

The optical column 104 includes a first lens 1104d, an aperture 1108d and a second lens 1112d. The first lens 1104d partially focuses the incoming ion beam 1102 towards the aperture 1108d. The aperture 1108d allows a fraction of the ions in the partially focused ion beam to pass through to the second lens 1112d. The second lens 1112d re-focuses the ion beam on to a point on the sample.

The assembly 1500, allows for ions generated from substantially all three atoms on the tip 108 of the emitter 106 to be focused. The aperture 1108d maintains a fairly large beam intensity by allowing a large fraction of the ions of the partially focused beam. The assembly 1500 allows for a substantial portion of the ion beam from three or more atoms to be focused on a sample. The assembly 1500 generates ion beams 1102 having larger beam spots as compared to assembly 1200.

The optical column 104 also includes elements to enhance the quality of the ion beam. FIG. 18 depicts an assembly 1600 having an ion source and an optical column configured to enhance the constitution of the ion beam according to one illustrative embodiment of the invention. In particular, FIG. 18 shows an ion source 102 generating an ion beam 1602 directed into the optical column 104. The optical column 104 includes optical elements 1604 and 1606, electrodes 1610 and a beam stop 1612. The assembly 1600 allows for purifying the ion beam 1602 such that stray neutral particles may be reduced prior to impinging on a sample. The beam 1602 is passed through consecutive regions of transverse electric and magnetic fields such that the ionic contents of the beam takes a more circuitous path through the optical column 104. Neutral particles mixed with the ion beam, however, typically follow a straight path down the optical column 104 and are captured by a beam stop 1612.

The optical elements 1604 and 1606 include elements similar to the first lens 1104, aperture 1108, scanning plate 1110 and second lens 1112. The electrodes 1610 are used to control the path of the ion beam 1602 through the optical column. The electrodes are located along the length of the optical column 18 and are capable of generating transverse electric and magnetic fields. The intensity and polarity of the transverse electric and magnetic fields may be modified to control the angle of deflection of the ion beam 1602. The path of the ion beam may also be modified by adjusting the location of the electrodes 1610.

The beam stop 1612 includes a cup shaped element for capturing neutral particles in the beam 1602. The stray neutral particles are minimally affected by the transverse electric and magnetic field and continue down the optical column 104 along path 1608. These stray neutral particles can be collected at the beam stop 1612.

Figure 19:
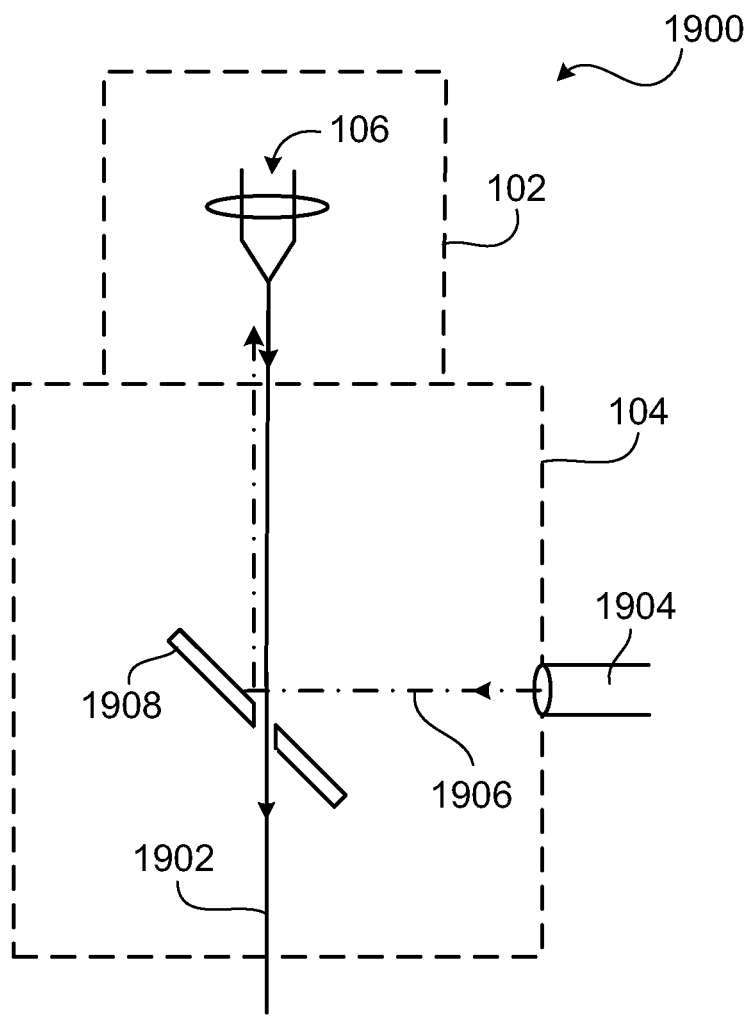
FIG. 19 depicts an ion source assembly having an ion source and an optical column configured to remove gas atoms adsorbed on the surface of the ion source according to one illustrative embodiment of the invention.

FIG. 19 depicts an assembly 1900 having an ion source 102 and an optical column 104 configured to remove gas atoms adsorbed on the surface of the emitter 106. In particular, FIG. 19 shows an ion source 102 generating an ion beam 1902 directed into the optical column 104. The optical column 104 includes a beam deflector 1908 and an opening to a laser source 1904. The beam deflector 1908 includes an aperture (similar to aperture 1108 of FIG. 13). The aperture allows for the ion beam 1902 to pass through the optical column 104. The beam deflector 1908 may include mirrors or other suitable reflective material. The laser source 1904 may be configured to deliver a collimated beam of laser light 1906 into the optical column 104. The laser source 1904 is connected such that the laser light 1906 is aimed at the beam deflector 1908. The beam deflector redirects the laser towards the emitter 106. In certain embodiments, the laser source 1904 may be movable such that the redirected laser light 1906 may be aimed at different locations on the emitter 106. The laser light 1906 impinging on the emitter 106 may have sufficient energy to remove atoms adsorbed on the surface of the emitter 106.

Those skilled in the art will know or be able to ascertain using no more than routine experimentation, many equivalents to the embodiments and practices described herein. Accordingly, it will be understood that the invention is not to be limited to the embodiments disclosed herein, but is to be understood from the following claims, which are to be interpreted as broadly as allowed under the law.

The invention claimed is:

1. An ion source, comprising:
   an emitter having a distal end that tapers to an atomic shelf including a number of atoms,
   a first gas source for delivering an imaging gas to a region near the distal end,
   a voltage source in electrical connection with the emitter for generating an electric field near the distal end of the emitter, thereby generating a particle beam from a region near the atomic shelf of the emitter and traveling in a direction away from the distal end of the emitter, and
   a second gas source for delivering a promoting gas wherein the promoting gas reacts with the emitter to shape the distal end.

2. The ion source of claim 1, comprising a tilting system coupled to the emitter, such that a longitudinal axis of the emitter is at angle from an axis of the particle beam.

3. The ion source of claim 1, wherein the particle beam includes at least one of an ion beam and an electron beam.

4. The ion source of claim 1, wherein the distal end of the emitter has substantially conical shape.

5. The ion source of claim 1, wherein the atomic shelf comprises between one and twelve atoms.

6. The ion source of claim 1, wherein the emitter is formed from a crystalline conductive material.

7. The ion source of claim 6, wherein the crystalline conductive material includes Tungsten.

8. The ion source of claim 7, wherein the tungsten is oriented such that the <111> crystal plane is substantially aligned with a longitudinal axis of the emitter.

9. The ion source of claim 1, wherein the length of the emitter is between 750 μm and 5 mm.

10. The ion source of claim 1, wherein the diameter of the emitter is between 50 μm and 1 mm.

11. The ion source of claim 1, comprising a base coupled to a proximal end of the emitter.

12. The ion source of claim 11, comprising at least one post rigidly attached to a portion of the base, and a heating element having a distal end and a proximal end, such that the distal end of the heating element is rigidly attached to a portion of the emitter and the proximal end of the heating element is attached to the at least one post.

13. The ion source of claim 12, wherein the emitter is rigidly attached to a plurality of heating elements.

14. The ion source of claim 12, wherein the length of the heating element is between 1 mm and 10 mm.

15. The ion source of claim 12, wherein the thickness of the heating element is between 100 μm and 750 μm.

16. The ion source of claim 12, comprising a reinforcement element attached to a portion of the base and the heating element.

17. The ion source of claim 1, comprising an optical column enclosing at least a portion of the emitter and oriented substantially parallel to a longitudinal axis such that the particle beam travels within the optical column.

18. The ion source of claim 17, wherein the optical column comprises a first field element capable of generating an electric field and a second field element capable of generating a magnetic field, such that the generated electric field and the magnetic field are transverse to each other.

19. The ion source of claim 18, further comprising a beam stop disposed in at least one location along a path of the particle beam.

20. The ion source of claim 18, wherein the optical column comprises a plurality of first field elements and a plurality of second field elements.

21. The ion source of claim 17, wherein the optical column defines a gas containing region.

22. The ion source of claim 21, wherein the gas includes at least one of an imaging gas and a promoting gas.

23. The ion source of claim 1, wherein the imaging gas includes at least one of helium, neon, argon, krypton, xenon and hydrogen.

24. The ion source of claim 1, wherein the promoting gas includes at least one of nitrogen, hydrogen and oxygen.

25. The ion source of claim 1, comprising a vacuum pump to remove at least one of the imaging gas and the promoting gas.

26. The ion source of claim 1, comprising a light source capable of delivering light to a portion of the distal end of the emitter, such that adsorbed atoms are removed.

27. The ion source of claim 26, wherein the light source includes a laser.

28. A method of operating an ion source, the method comprising:
    providing an emitter having a distal end, such that the distal end tapers to an atomic shelf including a predetermined number of atoms,
    providing neutral gas atoms to a region near the distal end,
    applying a voltage to the emitter such that the neutral gas atoms are ionized near the atomic shelf,
    generating an ion beam, including the ionized gas atoms, from a region near the atomic shelf, in a direction away from the distal end, and
    shaping the distal end, while operating the ion source, and further comprising changing the path of the ion beam by generating an electric field and a magnetic field transverse to each other in at least one location along a path of the ion beam.

29. The method of claim 28, wherein the path is predetermined, and further comprises the step of guiding the ion beam along the predetermined path by generating a plurality of electric fields and magnetic fields at predetermined locations along the path.

30. The method of claim 28, comprising the step of capturing a portion of the neutral gas atoms by placing a beam stop in at least one location along the path of the ion beam.

31. A method of maintaining an ion source, the method comprising:
    providing an ion source, comprising an emitter having a distal end, such that the distal end tapers to an atomic shelf, the emitter comprising an electrically conductive material,
    providing a gas to a region near the distal end of the emitter, the gas comprising at least one gas selected from the group consisting of nitrogen, oxygen, hydrogen, platinum and palladium,
    sharpening the ion source in situ by chemically reacting a portion of the gas with a portion of the electrically conductive material to form a gaseous complex, thereby removing some of the electrically conductive material from the emitter to reduce a width of the emitter in a region surrounding the atomic shelf.

32. The method of claim 31, wherein the step of sharpening the ion source includes applying a voltage to the ion source, such that another portion of the gas ionizes in a region near the atomic shelf of the emitter and prevents the atomic shelf from being removed.

33. The method of claim 31, wherein the gas comprises oxygen.

34. The method of claim 31, wherein the gas comprises nitrogen.

35. A method of manufacturing an ion source, the method comprising:
    providing an emitter having a proximal end and a distal end, such that the distal end tapers to an atomic shelf, the emitter comprising an electrically conductive material,
    coupling a base to the proximal end of the emitter,
    enclosing the base and the emitter in an optical column,
    connecting a gas source for providing a gas to a region of the emitter near the distal end,
    connecting a voltage source to the emitter for generating an electric field near the distal end of the emitter, such that the gas ionizes in the region near the distal end of the emitter,
    sharpening the ion source by chemically reacting a portion of the gas with a portion of the electrically conductive material to form a gaseous complex, thereby removing some of the electrically conductive material from the emitter and reducing a thickness of the emitter in a region away from the atomic shelf,
    wherein the gas comprises at least one gas selected from the group consisting of nitrogen, oxygen, hydrogen, platinum and palladium.

36. A method of manufacturing an electron source, the method comprising:

providing an emitter having a proximal end and a distal end, such that the distal end tapers to an atomic shelf, the emitter comprising an electrically conductive material, coupling a base to the proximal end of the emitter, enclosing the base and the emitter in an optical column, connecting a gas source for providing a gas to a region the emitter near the distal end, connecting a voltage source to the emitter for generating an electric field near the distal end of the emitter, such that electrons are emitted from a region near the distal end of the emitter, sharpening the electron source by chemically reacting a portion of the gas with a portion of the electrically conductive material to form a gaseous complex, thereby removing some of the electrically conductive material from the emitter to reduce a thickness of the emitter in a region away from the atomic shelf, wherein the gas comprises at least one gas selected from the group consisting of nitrogen, oxygen, hydrogen, platinum and palladium.

\* \* \* \* \*

UNITED STATES PATENT AND TRADEMARK OFFICE
CERTIFICATE OF CORRECTION

| | | |
|---|---|---|
| PATENT NO. | : 9,159,527 B2 | Page 1 of 1 |
| APPLICATION NO. | : 12/100570 | |
| DATED | : October 13, 2015 | |
| INVENTOR(S) | : Billy W. Ward et al. | |

It is certified that error appears in the above-identified patent and that said Letters Patent is hereby corrected as shown below:

Title page, Col. 1, lines 2-3, under "Inventors:", delete "John A. Notte" and insert -- John A. Notte IV --.

Page 3, Col. 2, line 16, delete "Muclear" and insert -- Nuclear --.

Page 3, Col. 2, line 28, delete "Intruments" and insert -- Instruments --.

Page 4, Col. 1, line 31, delete "Microelectric" and insert -- Microelectronic --.

Page 4, Col. 1, line 62, delete "Zeitshrift" and insert -- Zeitschrift --.

Page 4, Col. 2, line 4, delete "Feasiblity" and insert -- Feasibility --.

Specification

Col. 3, line 8, delete "laser" and insert -- laser. --.

Col. 10, line 3, delete "408" and insert -- 408. --.

Col. 14, line 30, delete "a an ion" and insert -- an ion --.

Claims

Col. 21, line 6, Claim 36, delete "region the" and insert -- region of the --.

Signed and Sealed this
Fifth Day of April, 2016

Michelle K. Lee
*Director of the United States Patent and Trademark Office*